US010839110B2

(12) United States Patent
Iorio et al.

(10) Patent No.: US 10,839,110 B2
(45) Date of Patent: Nov. 17, 2020

(54) TECHNIQUES FOR USING CONTROLLED NATURAL LANGUAGE TO CAPTURE DESIGN INTENT FOR COMPUTER-AIDED DESIGN

(71) Applicant: AUTODESK, Inc, San Rafael, CA (US)

(72) Inventors: Francesco Iorio, Toronto (CA); Wei Li, Richmond Hill (CA); Hyunmin Cheong, Toronto (CA)

(73) Assignee: AUTODESK, INC., San Rafael, CA (US)

( * ) Notice: Subject to any disclaimer, the term of this patent is extended or adjusted under 35 U.S.C. 154(b) by 459 days.

(21) Appl. No.: 14/707,869

(22) Filed: May 8, 2015

(65) Prior Publication Data

US 2015/0324491 A1  Nov. 12, 2015

Related U.S. Application Data

(60) Provisional application No. 61/991,181, filed on May 9, 2014.

(51) Int. Cl.
*G06F 30/00* (2020.01)
*G06F 8/41* (2018.01)
(Continued)

(52) U.S. Cl.
CPC ............... *G06F 30/00* (2020.01); *G06F 8/10* (2013.01); *G06F 8/425* (2013.01); *G06F 8/427* (2013.01);
(Continued)

(58) Field of Classification Search
CPC .......... G06F 17/50; G06F 3/0481; G06F 8/10; G06F 8/425; G06F 8/427; G06F 17/28; G06F 17/30312; G06F 17/3053
See application file for complete search history.

(56) References Cited

U.S. PATENT DOCUMENTS 5,386,556 A * 1/1995 Hedin .................. G06F 17/271
5,974,413 A * 10/1999 Beauregard ......... G06F 9/45512
(Continued)

OTHER PUBLICATIONS

Kou et al, Knowledge-guided inference for voice-enabled CAD, Coumputer-Aided Design 42 (2010) 545-557, 2010.*
(Continued)

*Primary Examiner* — Rehana Perveen
*Assistant Examiner* — Chuen-Meei Gan
(74) *Attorney, Agent, or Firm* — Artegis Law Group, LLP

(57) ABSTRACT

A computing device for receiving a design problem statement describing a design problem in a controlled natural language (CNL) that defines permitted lexicons and syntax structures. The design problem statement is processed using the CNL lexicons and syntax structures to produce a job description executable by a design application for generating a design solution for the design problem statement. An improved CNL user interface that assists users to produce valid design problem statements that are CNL-compliant. The CNL user interface receives user-selectable terms that are compliant with the CNL lexicons and generates candidate problem statements that are compliant with CNL syntax structures and receives a selection of a candidate problem statement that is added to the design problem statement. A graphical user interface may display a graphical representation of a design problem statement that can be directly modified. A dialogue-based design process to explore possible design intentions and design solutions.

23 Claims, 15 Drawing Sheets

(51) Int. Cl.
    *G06F 16/22*       (2019.01)
    *G06F 16/2457*     (2019.01)
    *G06F 8/10*        (2018.01)

(52) U.S. Cl.
    CPC ........ *G06F 16/22* (2019.01); *G06F 16/24578* (2019.01)

(56) References Cited

U.S. PATENT DOCUMENTS

| | | | | |
|---|---|---|---|---|
| 6,112,133 | A * | 8/2000 | Fishman | G05B 19/40937 700/180 |
| 6,295,513 | B1 * | 9/2001 | Thackston | G05B 19/4099 703/1 |
| 6,343,285 | B1 * | 1/2002 | Tanaka | G06Q 10/04 700/106 |
| 6,701,294 | B1 * | 3/2004 | Ball | G06F 17/30392 704/257 |
| 6,968,341 | B2 * | 11/2005 | Hand | G06F 11/323 345/440.1 |
| 7,409,335 | B1 * | 8/2008 | Horvitz | G06F 17/30705 704/9 |
| 7,555,431 | B2 * | 6/2009 | Bennett | G06F 17/27 704/255 |
| 7,733,339 | B2 * | 6/2010 | Laning | G06F 17/50 345/419 |
| 8,441,502 | B2 * | 5/2013 | Reghetti | G06F 17/50 345/635 |
| 8,595,171 | B2 * | 11/2013 | Qu | 703/13 |
| 9,613,020 | B1 * | 4/2017 | Jacobs, II | G06F 17/50 |
| 2001/0047251 | A1 * | 11/2001 | Kemp | G06F 17/5004 703/1 |
| 2002/0107673 | A1 * | 8/2002 | Haller | G05B 19/41805 703/1 |
| 2004/0181390 | A1 * | 9/2004 | Manson | G06F 17/271 704/2 |
| 2005/0071135 | A1 * | 3/2005 | Vredenburgh | G06F 17/5004 703/1 |
| 2005/0091036 | A1 * | 4/2005 | Shackleton | G06F 17/271 704/9 |
| 2005/0168460 | A1 * | 8/2005 | Razdan | G06F 17/30398 345/419 |
| 2006/0116986 | A1 * | 6/2006 | Radcliffe | G06F 17/30392 |
| 2007/0168922 | A1 * | 7/2007 | Kaiser | G06F 17/2881 717/104 |
| 2008/0269942 | A1 * | 10/2008 | Free | G06F 17/50 700/182 |
| 2009/0058860 | A1 * | 3/2009 | Fong | G06F 17/211 345/467 |
| 2010/0204961 | A1 * | 8/2010 | Saifullah | G06F 17/50 703/1 |
| 2011/0213757 | A1 * | 9/2011 | Bhaskaran | G06Q 10/06 707/687 |
| 2012/0221136 | A1 * | 8/2012 | Yucel | G06F 17/5086 700/103 |
| 2012/0254143 | A1 * | 10/2012 | Varma | G06F 16/243 707/706 |
| 2012/0290987 | A1 * | 11/2012 | Gupta | G06F 3/04815 715/848 |
| 2013/0268260 | A1 * | 10/2013 | Lundberg | G06F 17/28 704/8 |
| 2014/0067333 | A1 * | 3/2014 | Rodney | G06T 19/00 703/1 |

OTHER PUBLICATIONS

Chen et al, Formalisation of product requirements: from natural language descriptions to formal specifications, Int. J. Manufacturing Research, VOl. 2, No. 3, 2007. p. 362-387.*

X. Y. Kou and S. T. Tan, Design by Talking with Computers, Computer-Aided Design & Applications, 5(1-4), 2008, 266-277 (Year: 2008).*

S. Xue, X. Y. Kou and S. T. Tan, Natural Voice-Enabled CAD: Modeling via Natural Discourse, Computer-Aided Design & Applications, 6(1), 2009, 125-136 (Year: 2009).*

Chen ZY, Yao S, Lin JQ, Zeng Y, and Eberlein A, "Formalisation of Product Requirements: from Natural Language Descriptions to Formal Specifications", Int. J. Manuf. Res., vol. 2, No. 3, 2007, pp. 362-387.

Chu C-CP, Dani TH, Gadh R ( 1997) Multi-sensory user interface for a virtual-reality-based computer-aided design system. Computer-Aided Design 29(10): 709-725.

Duan Y, Cruz C (2011) Formalizing semantic of natural language through conceptualization from existence. Int. J. Innovation, Management and Technology 2(1): 37-42.

Gero JS, "Towards a Model of Exploration in Computer-Aided Design", In: JS Gero and E Tyugu (eds), Formal Design Methods for Computer-Aided Design, North-Holland, Amsterdam, 1994, pp. 271-291.

Grossman T, Fitzmaurice G, and Attar R, "A Survey of Software Learnability: Metrics, Methodologies and Guidelines"CHI '12, 2012, pp. 649-658.

Hirtz J, Stone RB, Szykman S, McAdams DA and Wood KL, "A Functional Basis for Engineering Design: Reconciling and Evolving Previous Efforts", NIST Technical Note 1447, 2002.

Kou XY, Xue SK and Tan ST, "Knowledge-Guided Inference for Voice-Enabled CAD", Computer-Aided Design, vol. 42, 2010, pp. 545-557.

Kurtoglu T, Campbell MI (2009) Automated synthesis of electromechanical design configurations from empirical analysis of function to fom1 mapping. Journal of Engineering Design 20(1): 83-104.

Sarkar S, Sharma VS and Agarwal R, "Creating Design from Requirements and Use Cases: Bridging the Gap between Requirement and Detailed Design", Proc. of India Software Eng. Conf. '12, 2012, pp. 3-12.

Schwitter R, "Controlled Natural Language for Knowledge Representation", Coling 2010, Poster Volume, 2010, pp. 1113-1121.

Sharma A, Madhvanath S, Shekhawat A, and Billinghurst M, "MozArt: A Multimodal Interface for Conceptual 3D Modeling", ICIM '11, 2011, pp. 307-310.

Ullman DG, "The Mechanical Design Process", McGraw-Hill, New York, 1992.

Valentine S, Vides F, Lucchese G, Turner D, Kim H, Li W, Linsey J and Hammond T, "Mechanix: A Sketch-Based Tutoring & Grading System for Free-Body Diagrams", AI Magazine, vol. 34, No. 1, 2012, 55-66.

Wang R, Paris S and Popovic J, "6D Hands: Markerless Hand-Tracking for Computer Aided Design", Proc. of UIST '11, 2011, pp. 549-558.

Altshuller GS (1999) The Innovation Algorithm: TRIZ, Systematic Innovation and Technical Creativity. Technical Innovation Center Inc.: Worcester.

Becallini N, Borgianni Y, Cascini G, Rotini F (2012) Model and algorithm for computer-aided inventive problem analysis. Computer-Aided Design 44: 961-986.

Boroditsky L (2011) How language shapes thought. Scientific American, Feb. 2011.

Brown D, Blessing L (2005) The relationship between function and affordance. Proc. ASME IDETC, Long Beach, CA, Sep. 24-28, DTM-85017.

Chakrabarti A, Bligh TP (1996) An approach to functional synthesis of solutions in mechanical conceptual design, Part HI: Spatial configuration. Research in Engineering Design 8(2): 116-124.

Chiu I, Shu LH (2007) Using language as related stimuli for concept generation. AIEDAM 21(2): 103-121.

Elsen C, Demaret J-N, Yang MC (2012) Sketch-based interfaces for modeling and user' needs: Redefining connections. AIEDAM 26(3): 281-301.

Gero JS (1990) Design prototypes: A knowledge representation schema for design. AI Magazine 11(4): 26-36.

Hauser JR, Clausing D (1988) The house of quality. Harvard Business Review, May-Jun., pp. 63-73.

Jansson DG, Smith SM (1991) Design fixation. Design Studies 12(1): 3-11.

(56) References Cited

OTHER PUBLICATIONS

Kruger C, Cross N (2006) Solution-driven vs. problem driven design: strategies and outcomes. Design Studies 27(5): 527-548.
Landis JR, Koch GG (1977) The measurement of observer agreement for categorical data. Biometrics 33(1):159-174.
Linsey JS, Markman AB, Wood KL (2012) Design by analogy: A study of the WordTree method for problem representation. Journal of Mechanical Design 134(4): 041009.
Maier J, Fadel G (2009) Affordance-based design methods for innovative design, redesign and reverse engineering. Research in Engineering Design 20(1): 225-239.
Nocedal J, Wright S (2000) Numerical Optimization. Springer: New York.
Otto K, Wood K (200 I) Product Design: Techniques in Reverse Engineering and New Product Development. Prentice-Hall: Upper Saddle River, NJ.
Srivastava J, Shu LH (2013) Affordances and product design to support environmentally conscious behavior. Journal of Mechanical Design 135: 101006.
Umeda Y, Ishii M, Yoshioka M, Shimomura Y, Tomiyama T ( 1996) Supporting conceptual design based on the function-behaviour-state modeler. AIEDAM 10(4): 275-288.
Vattam SS, Helms ME, Goel AK (20 I 0) A content account of creative analogies in biologically inspired design. AIEDAM 24(4): 467-481.

\* cited by examiner

Function:
- The design should *Function (MechQuantify) (prepositionlof) Object*
- The design should *Function (MechQuantify) (prepositionlof) Object1 (preposition) Object2*
- The design should *Function Object1 (NumValue) (preposition) Object2*

Objective:
- *MechQuantity* of the design must be *ObjectiveFunction*
- *GeomQuantity* of the design must be *ObjectiveFunction*

Constraint:
- *MechQuantity* of the design must be *MathOperator NumValue*
- *GeomQuantity* of the design must be *MathOperator NumValue*
- *MechQuantity* of the design must be *MathOperator MechQuantity of Object*
- *GeomQuantity* of the design must be *MathOperator GeomQuantity of DesignlObject*

Environment object:
- *MechQuantity of Object* is *NumValue*
- *GeomQuantity of Object* is *NumValue*

Environment interaction:
- *Object1* is *Function (NumValue) (prepositionlof) Object2*
- *Object1* is *Function (MechQuantity) (prepositionlof) Object2*

310 — *Object:*
bicycle, trunk, roof, bumper, design, bracket, shelf, door, frame, wall, ceiling, ground...

320 — *Function:*
separate, divide, distribute, transfer, transmit, guide, translate, connect, couple, join, link, stop, prevent, inhibit, store, contain, collect, supply, support, stabilize, secure, position...

330 — *ObjectiveFunction:*
minimize, maximize

340 — *MechQuantity:*
force, load, pressure, torque, weight, strength, hardness...

350 — *GeomQuantity:*
length, width, height, thickness, depth, area, volume, clearance, interference, distance...

360 — *MathOperator:*
greater than, smaller than, equal to, different from...

370 — *NumValue:*
any numerical value + unit of measure

Figure 3

TECHNIQUES FOR USING CONTROLLED NATURAL LANGUAGE TO CAPTURE DESIGN INTENT FOR COMPUTER-AIDED DESIGN

CROSS-REFERENCE TO RELATED APPLICATIONS

This application claims the benefit of United States provisional patent application titled, "Controlled Natural Language and Formal Graph Data to Capture Design Intent and Related Interfaces for Computer-Aided Design Applications," filed on May 9, 2014 and having Ser. No. 61/991,181. The subject matter of this related application is hereby incorporated herein by reference.

BACKGROUND OF THE INVENTION

Field of the Invention

Embodiments of the present invention generally relate to computer science and, more specifically, to techniques for using controlled natural language to capture design intent for computer-aided design.

Description of the Related Art

Designers use computer-aided design (CAD) systems to assist in developing solutions to design problems. Among other things, CAD systems provide complex functions to explore design solutions and support design modeling at the direction of the designer. In general, CAD systems are powerful tools that can significantly shorten product development cycles.

Existing CAD systems mainly support the analysis and modeling of design solutions. One drawback of conventional CAD systems is that the design solutions must be generated by the designers in advance. Some CAD systems have also been developed to assist in finding solutions for design problems. These systems may leverage existing design solutions as reference solutions. Another drawback of such conventional systems is that designers must thoroughly understand the interface framework and use-specific inputs of the system that can be used by the designers to retrieve the proper solutions for their given design problems. Such requirements can be quite challenging for designers and oftentimes require designers to spend an inordinate amount of time learning and managing the interface and system inputs instead of focusing on the design problems at hand.

As the foregoing illustrates, there is a need in the art for more effective techniques for developing solutions to design problems using CAD systems.

SUMMARY OF THE INVENTION

One embodiment of the invention includes a computer-implemented method for processing a design problem statement. The method includes receiving the design problem statement describing a design problem, the design problem statement comprising a set of problem statements in a controlled natural language (CNL) that defines lexicons and syntax structures permitted for the problem statements. The method further includes processing the design problem statement using the lexicons and syntax structures of the CNL to produce an executable job description that, when executed, produces the design solution for the design problem statement.

At least one advantage of the disclosed technique is that the CAD system can receive, in CNL, a design problem statement specifying goals and intentions for a design solution and then produce the actual design solution. With such an approach, the designer does not have to produce the design solution or spend time learning complicated user interfaces and input schemes.

One embodiment of the invention includes a computer-implemented method for generating a design problem statement comprising a set of problem statements compliant with a controlled natural language (CNL) that defines lexicons and syntax structures permitted for problem statements. The method includes receiving a set of one or more selectable terms that are compliant with lexicons of the CNL, generating a set of one or more candidate problem statements based on the received set of selectable terms and syntax structures of the CNL, and receiving a selection of a candidate problem statement in the set candidate problem statements, the selected candidate problem statement comprising a problem statement compliant with the lexicons and syntax structures of the CNL.

At least one advantage of the disclosed technique is that the CNL user interface allows users not proficient in the lexicons and/or syntax structures of the CNL to easily and more effectively produce a valid design problem statement.

One embodiment of the invention includes a computer-implemented method for receiving a design problem statement that is compliant with a controlled natural language (CNL) that defines permitted lexicons and syntax structures, the design problem statement specifying a plurality of objects and at least one relationship between two objects. The method further includes displaying, in a graphical user interface, a graphical representation of the received design problem statement, the graphical representation comprising a plurality of nodes representing the plurality of objects and at least one edge representing the at least one relationship.

At least one advantage of the disclosed technique is that the graphical user interface provides immediate visual feedback of the received design problem statement to verify that the received design problem statement is the intended design problem statement before conversion to an executable job description, thus saving time and processing resources.

One embodiment of the invention includes a computer-implemented method for receiving, from a multimodal user interface engine, a first design intention description describing goals of a design problem. The first design intention description is mapped to a first set of observations describing different aspects of the first design intention description. A first set of actions is then determined and executed based at least in part on the first set of observations, the first set of actions comprising producing a first modified design intention description for displaying in the multimodal user interface engine. The first set of actions may further comprise producing one or more executable job descriptions for producing one or more suggested design solutions for the first design intention description.

At least one advantage of the disclosed technique is that the dialogue-based design process allows a user to more fully explore possible design intention descriptions and design solutions in an iterative manner. The iterative dialogue-based design process may assist the user to find an optimal design solution.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a conceptual diagram of the syntax database of FIG. 1, according to one embodiment of the present invention;

FIG. 3 is a conceptual diagram of the lexicon database of FIG. 1, according to one embodiment of the present invention;

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
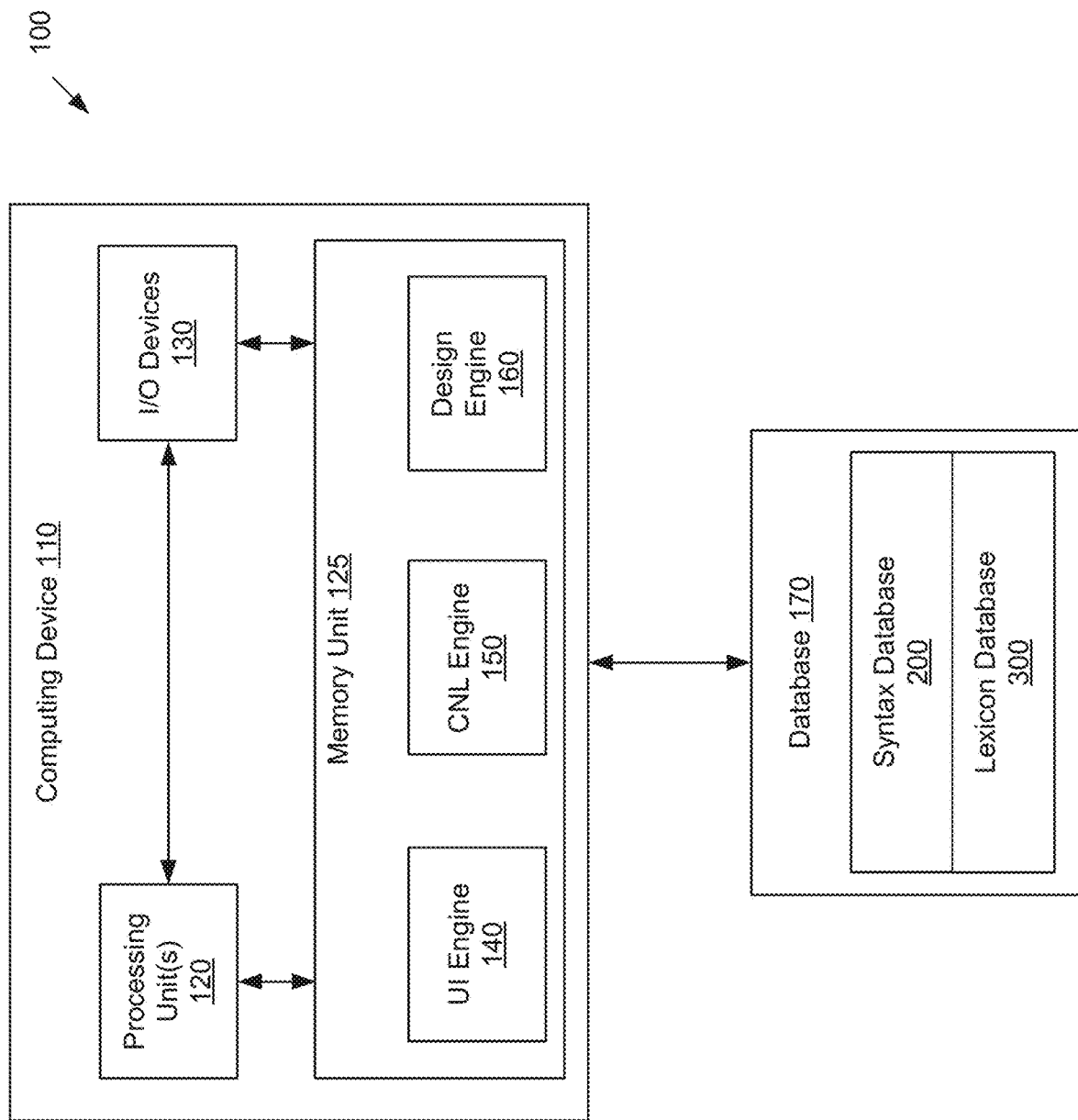
FIG. 1 illustrates a system configured to implement one or more aspects of the present invention.

FIG. 1 illustrates a system 100 configured to implement one or more aspects of the present invention. As shown, the system 100 includes, without limitation, a computing device 110 coupled to a database 170. Computing device 110 may be a server system, client system, workstation, a laptop computer, a tablet or hand-held device, or any other type of computing device. The system 100 may comprise a computer-aided design (CAD) system.

Computing device 110 includes one or more processing units 120 coupled to input/output (I/O) devices 130 and to memory unit 125. Processing unit(s) 120 may be a central processing unit (CPU), a graphics processing unit (GPU), or a combination of different processing units, such as a CPU configured to operate in conjunction with a GPU. In general, processing unit 120 may be any technically feasible hardware unit capable of processing data and/or executing software applications. I/O devices 130 are also coupled to memory unit 125 and includes input devices capable of receiving user input, output devices capable of generating output, as well as network devices capable of communicating via a network (not shown). Examples of input devices include a keyboard, a mouse, a touchscreen, a microphone, or other input elements. Examples of output devices include a monitor, a printer, or other output elements. The input and output devices allow an end-user access to the system 100. Memory unit 125 includes a user interface (UI) engine 140, a controlled natural language (CNL) engine 150, and a design engine 160. A user/designer may input text information, received by the UI engine 140, by typing on a keyboard. In other embodiments, a user/designer may input audio information, received by the UI engine 140, by speaking into a microphone. In these embodiments, the UI engine 140 comprises speech recognition software to process the received speech audio and convert to text information.

Computing device 110 is coupled to the database 170 comprising a syntax database 200 and lexicon database 300. The syntax database 200 organizes and stores syntax/sentence structures permitted for problem statements. In some embodiments, there are a plurality of different types of problem statements, each type of problem statement having an associated set of syntax/sentence structures that are permitted for that type of problem statement. Thus, the syntax database 200 may organize and store grammar rules for syntax structures permitted in the problem statements. The lexicon database 300 organizes and stores a set of lexicons specifying terms permitted for problem statements. Thus, the lexicon database 300 may organize and store a dictionary of terms permitted in the problem statements. A term may comprise a word, number value, or math operator.

In some embodiments, the UI engine 140 receives a design problem statement from a user/designer (e.g., via keyboard or microphone). The design problem statement describes a design problem and specifies goals and intentions of a design solution for the design problem. The design problem statement comprises a set of one or more problem statements. The problem statements may be expressed using a controlled natural language (CNL) that specifies limited and predefined lexicons and syntax structures that are permitted for the problem statements. The CNL engine 150 may receive the design problem statement specified in CNL, process the set of problem statements of the design problem statement using the lexicon database 300 and syntax database 200, and produce an executable job description (e.g., set of executable commands or scripts). The design engine 160 may receive the executable job description to produce a design solution for the design problem statement. The design engine 160 may comprise a design application, such as a computer-aided design (CAD) application, computer-aided engineering (CAE) application, simulator application, modeler application, geometry generator application, or the like.

Design Problem Statement Specified in Controlled Natural Language

The design problem statement comprises a set of one or more problem statements that specify the goals and intent of a design problem. The design problem statement may reflect the designer's definition of the design problem. In some embodiments, the problem statements are expressed using a controlled natural language (CNL) described herein. The controlled natural language may comprise a human-based language (natural language) and not a computer-based language (e.g., software or machine language). In these embodiments, the controlled natural language comprises a natural language but with significantly reduced and limited lexicons and syntax/sentence structures (as compared with the natural language). While natural language can give the most amount of expressiveness for users to describe design problems, a high degree of computational complexity is involved in processing natural language input The CNL defines terms of the lexicons and syntax structures which are the only terms and syntax structures permitted and accepted in the problem statements. By limiting the lexicons and syntax structures permitted in the problem statements, the ambiguity and computational complexity can be significantly reduced when processing the problem statements, as compared to processing problem statements that permit all of a natural language without restriction. Also, users/designers only need to learn the allowed lexicons and syntax structures defined by the CNL, instead of an entirely new input interface and method, thereby reducing complexity and increasing ease-of-use. Thus, the CNL described herein may comprise a precisely defined subset of a natural language that restricts the lexicons and syntax structures to reduce ambiguities and complexities in the language.

In some embodiments, the CNL defines a plurality of different types of problem statements, each type of problem statement describing a different aspect of the design problem and/or design solution. FIG. 2 is a conceptual diagram of the syntax database of FIG. 1, according to one embodiment of the present invention. As shown in the example of FIG. 2, the CNL defines and the syntax database 200 stores predefined syntax structures for five different types of problem statements including function 210, objective 220, constraint 230, environment object 240, and environment interaction 250. Note that the number and types of problem statements shown in FIG. 2 are examples for illustrative purposes only. In other embodiments, the CNL defines and the syntax database 200 stores syntax structures for more or less than five different types of problem statements and/or other types of problem statements.

A "function" problem statement 210 may describe the functional requirements of the design solution, the intended purpose of the design solution, and/or what the design solution should do. For example, a function problem statement may specify that "a bracket is to support a structure." Typically, a function problem statement does not describe how well the design solution should perform. A design problem statement may comprise one or more function problem statements.

An "objective" problem statement 220 may specify a property in the design solution to be maximized or minimized. Thus, an objective problem statement may specify optimizations for the design solution and include measurable criteria for evaluating the effectiveness of the design solution (how well the design solution solves the design problem). For example, an objective problem statement may specify that "an objective is to minimize the weight of the bracket." A design problem statement may comprise one or more objective problem statements.

A "constraint" problem statement 230 may specify a limit on a property of the design solution that the design solution must not violate. Thus, a constraint problem statement sets a quantifiable limit of a property that the design solution cannot exceed. For example, a constraint problem statement may specify that "the bracket cannot be wider than 3 cm." A design problem statement may comprise one or more constraint problem statements.

Note that the design solution should meet all specified objectives and constraints while achieving the function requirements. Objectives and constraints will reduce the number of possible design solutions that satisfy the functional requirements. However, objectives are different than constraints in that objectives are used to judge how well the design solves the design problem (design optimization) while constraints set quantifiable limits that the design cannot violate. The performance of a design solution may be measured by how well the design solution satisfies its functions while meeting all objectives and constraints.

An "environment object" problem statement 240 may specify a property of an interacting object in the environment of the design solution. An interacting object will interact with the design solution and have one or more properties that must be considered when generating the design solution. For example, an environment object problem statement may specify that "the weight of the shelf is 50 kg." A design problem statement may comprise one or more environment object problem statements. An "environment interaction" problem statement 250 may specify a relationship between two environment/interacting objects. For example, an environment interaction problem statement may specify that "the shelf is located 2 m above the ground." A design problem statement may comprise one or more environment interaction problem statements.

In some embodiments, a design problem statement comprises at least one function problem statement. In other embodiments, a design problem statement comprises at least one function problem statement, and at least one other type of problem statement (such as an objective or constraint problem statement). In further embodiments, a design problem statement comprises at least one function problem statement, at least one objective problem statement, and at least one constraint problem statement. In these embodiments, the design problem statement comprises a constrained optimization problem for maximizing or minimizing a specified property of the design while not violating at least one specified constraint.

For each type of problem statement, the CNL defines and the syntax database 200 stores an associated set of one or more predefined syntax structures that are permitted for that type of problem statement. The syntax database 200 may organize and store grammar rules for the sets of syntax structures for the different types of problem statements. For example, as shown in FIG. 2, a function problem statement may have three predefined syntax structures, an objective problem statement may have two predefined syntax structures, a constraint problem statement may have four predefined syntax structures, an environment object problem statement may have two predefined syntax structures, and an environment interaction problem statement may have two predefined syntax structures. Note that the number and types of syntax structures shown in FIG. 2 are examples for illustrative purposes only. In other embodiments, the CNL defines and the syntax database 200 stores a different number of syntax structures for each type of problem statement and/or other syntax structures for each type of problem statement. For example, additional syntax structures may be included for each type of problem statement that include different sentence structures with the same meaning, such as statements written in the passive voice.

In general, each predefined syntax/sentence structure for a problem statement may specify a set of one or more required fixed terms and a set of one or more user-selectable terms, as well as the position and order of the fixed terms and the user-selectable terms within the problem statement. In particular, the syntax/sentence structure may specify the user-selectable terms by specifying particular types of user-selectable terms. Thus, a syntax structure may precisely specify the position and order of fixed terms and one or more types of user-selectable terms within the problem statement. A term may comprise a word, number value, or math operator. In the example syntax structures shown in FIG. 2, a fixed term is shown in normal font and types of user-selectable terms are shown in italics. For example, the second syntax structure for "Objectives" is "GeomQuantity of the design must be ObjectiveFunction," where "of the design must be" are fixed terms and "GeomQuantity," and "ObjectiveFunction" are types of user-selectable terms. As another example, the first syntax structure for "Constraints" is "MechQuantity of the design must be MathOperator Num Value" where "of the design must be" are fixed terms and "MechQuantity," "Math Operator," and "Num Value" are types of user-selectable terms.

The user-selectable terms in the syntax structures may comprise a plurality of different types of user-selectable terms. In the example of FIG. 2, there are seven different types of user-selectable terms including Object, Function, ObjectiveFunction, MechQuantity, GeomQuantity, Math Operator, and Num Value. The user-selectable terms that are permitted in the syntax structures is predefined by the CNL and stored in the lexicon database 300. FIG. 3 is a conceptual diagram of the lexicon database of FIG. 1, according to one embodiment of the present invention. As shown in the example of FIG. 3, the CNL defines and the lexicon database 300 stores a lexicon of predefined terms for each of seven different types of user-selectable terms, including lexicons for Object 310, Function 320, ObjectiveFunction 330, MechQuantity 340, GeomQuantity 350, MathOperator 360, and Num Value 370. Thus, the lexicon database 300 stores a set of seven lexicons 310-370 for the seven different types of user-selectable terms. The lexicon database 300 may organize and store a dictionary of user-selectable terms permitted in the problem statements. Note that the seven different types of user-selectable terms shown in FIG. 3 are examples for illustrative purposes only. In other embodiments, the CNL defines and the lexicon database 300 stores other types of user-selectable terms. Note that the terms shown in FIG. 3 for the different types of user-selectable terms are examples for illustrative purposes only. In other embodiments, the CNL defines and the lexicon database 300 stores other terms for the different types of user-selectable terms.

The lexicon for Object 310 may include terms for objects specific to the design problem, where the terms may change depending on the particular design problem. The lexicon for Function 320 may include terms selected from primary, secondary, and tertiary function terms from functional basis terminology. The lexicon for ObjectiveFunction 330 may include terms based on the assumption that all optimization problems involving maximizing or minimizing a certain property. The lexicons for MechQuantity 340, GeomQuantity 350, and MathOperator 360 may include terms based on typical static design and design problem models. The lexicon for Num Value 370 may include any numerical value and a unit of measure (e.g., 50 g, 500 kg, 25 cm, 5 m, etc.).

As described above, a design problem statement may be received through the UI engine 140, the design problem statement specified in a CNL that defines lexicons and syntax structures that are permitted for the design problem statement. The CNL engine 150 may receive and process/analyze the design problem statement using the lexicon database 300 and syntax database 200 and produce an executable job description (e.g., set of executable commands or scripts). Restricting the lexicon and syntax of the design problem statement enables the CNL engine 150 to perform machine translation of the design problem statement into a formal representation (executable job description). The design engine 160 may then receive and execute the job description to produce a design solution for the design problem statement.

Figure 4:
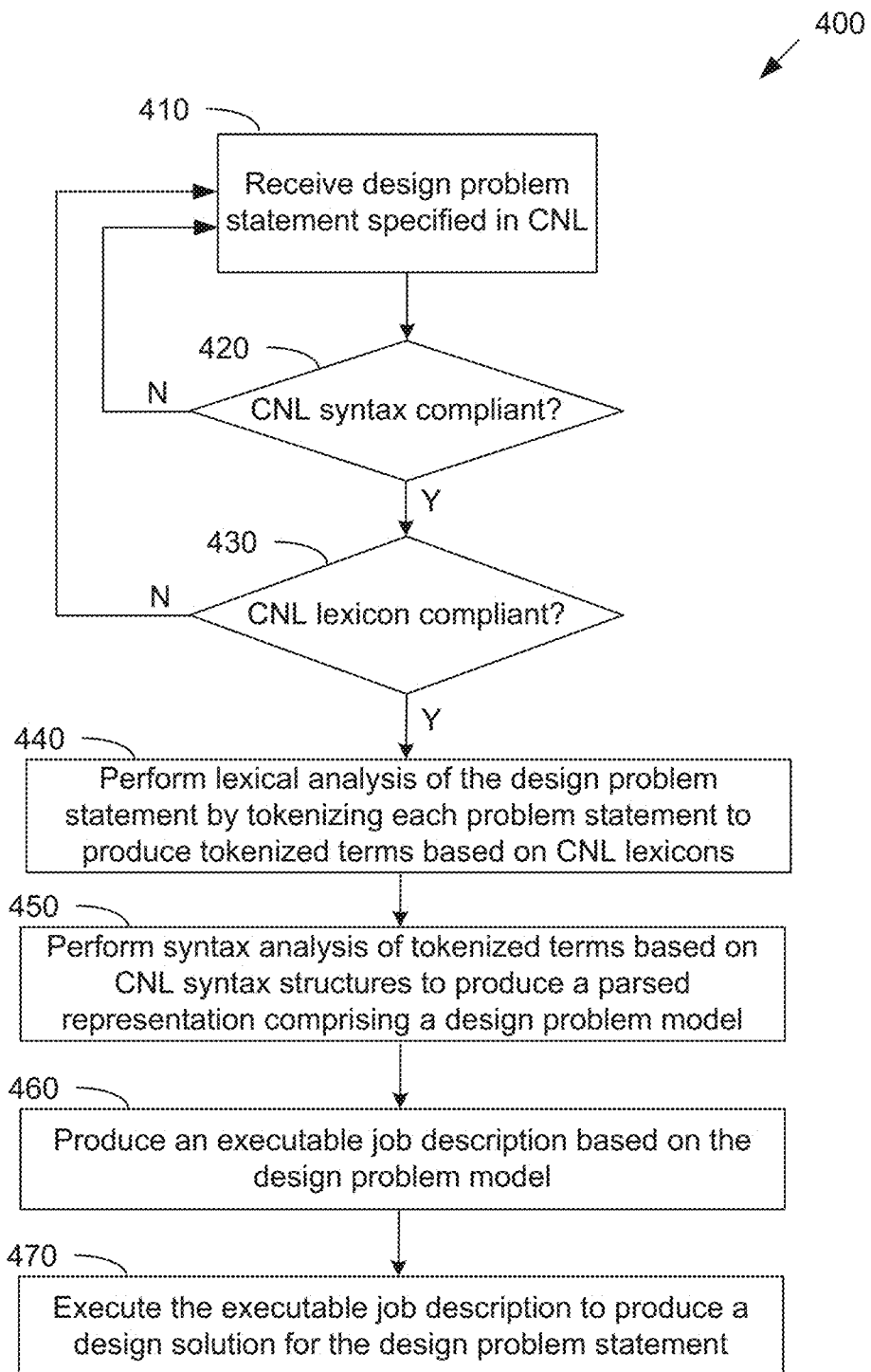
FIG. 4 illustrates a flow diagram of method steps for generating a design solution for a design problem statement, according to one embodiment of the present invention.

FIG. 4 illustrates a flow diagram of method steps for generating a design solution for a design problem statement, according to one embodiment of the present invention. Although the method steps are described in conjunction with the systems of FIG. 1-3, persons skilled in the art will understand that any system configured to perform the method steps, in any order, is within the scope of the present invention.

As shown, a method 400 begins at step 410, where UI engine 140, when executed by processing unit 120, receives a design problem statement from a user/designer that describes a design problem and specifies goals and/or intentions of a design solution for the design problem. The design problem statement is specified in a CNL that specifies limited lexicons and syntax/sentence structures. The design problem statement comprises a set of one or more problem statements comprising one or more different types of problem statements (e.g., function, objective, constraint, etc.).

At step 420, the CNL engine 150 determines if the design problem statement is compliant with the predefined syntax structures of the CNL. A syntax database 200 organizes and stores syntax structures permitted for each type of problem statement and stores grammar rules for the syntax structures. Each predefined syntax structure specifies the position and order of fixed terms and one or more types of user-selectable terms within a problem statement. The CNL engine 150 may determine CNL syntax compliance by verifying that each of the problems statements of the design problem statement conform to a syntax structure stored in the syntax database 200. If the design problem statement does not conform with syntax structures of the CNL, the method 400 proceeds to step 410 where the UI engine 140 receives another design problem statement from the user/designer. If the design problem statement conforms with syntax structures of the CNL, the method 400 proceeds to step 430.

At step 430, the CNL engine 150 determines if the design problem statement is compliant with the predefined lexicons of the CNL. A lexicon database 300 organizes and stores a set of lexicons specifying terms permitted for user-selectable terms of the problem statements. The CNL engine 150 may determine CNL lexicon compliance by verifying that each of the problems statements of the design problem statement contain user-selectable terms that conform with the lexicons stored in the lexicon database 300. If the design problem statement does not conform with lexicons of the CNL, the method 400 proceeds to step 410 where the UI engine 140 receives another design problem statement from the user/designer. If the design problem statement conforms with lexicons of the CNL, the method 400 proceeds to step 440.

As described below, in steps 440-460 the CNL engine 150 processes (tokenizes and parses) problem statements of the design problem statement using the lexicon database 300 and syntax database 200 to produce a parsed representation of the design problem statement, the parsed representation comprising a design problem model. Based on the design problem model, the CNL engine 150 then produces an executable job description that is executable by a design engine 160 to produce a design solution for the design problem statement.

At step 440, the CNL engine 150 performs lexical analysis of the design problem statement by tokenizing each problem statement to produce a set of tokenized terms for each problem statement based on the predefined lexicons of the CNL. The CNL engine 150 may decompose each problem statement into a set of user-selectable terms based the type of user-selectable term (e.g., by categorizing each user-selectable term based the type of user-selectable term). As an example, assume a function problem statement states "the design must support the weight of the shelf." The lexical analysis of the function problem statement may produce the set of tokenized terms: "Object (design), Function (support), MechQuantity (weight), and Object (shelf)."

At step 450, the CNL engine 150 then performs syntax analysis of the sets of tokenized terms of the design problem statement based on the syntax structures of the CNL. The CNL engine 150 may perform grammar and syntax analysis of the sets of tokenized terms based on the syntax structures of the CNL stored to the syntax database 200. The syntax analysis may parse the tokenized terms of each problem statement of the design problem statement to produce a parsed representation of each problem statement. The parsed representation of a problem statement may comprise the type of problem statement (e.g., function, objective, constraint, etc.), a list of object names, and relationships between the objects. For example, for the set of tokenized terms for the problem statement given in the above example, the syntax analysis may produce a parsed representation of the problem statement comprising: "problem statement type: Function, Object 1: design, Object 2: shelf, Relationship: support." The set of parsed representations of the set of problem statements of the design problem statement comprises a design problem model that can be computationally solved and converted into an executable job description.

At step 460, the CNL engine 150 produces an executable job description based on the design problem model. The executable job description may comprise a set of executable commands or scripts that when executed by a design engine 160, produce a design solution for the design problem statement. Executable job descriptions may comprise objective functions, constraints, and boundary conditions. An objective function comprises a design variable to be minimized/maximized. A constraint may comprise allowed ranges for other design variables. A boundary conditions may comprise forces or other mechanical quantities applied on the design. In general, objective statements may be translated into objective functions (e.g., minimize (MechQuantity)), constraint statements may be translated into constraints (e.g., GeomQuantity<50), and function statements and environment object statements may be translated into boundary conditions (e.g., ForceApplied= Object.MechQuantity). These example expressions may be expressed in a programming language used to communicate to the design engine 160.

At step 470, the design engine 160 executes the executable job description to produce a design solution. The design solution comprises a solution for a design problem that is specified in the design problem statement. The design engine 160 may comprise a design application, such as a computer-aided design (CAD) application, computer-aided engineering (CAE) application, simulator application, modeler application, geometry generator application, or the like. For example, the design engine 160 may produce a computer-aided design or a set of geometries that solves the design problem statement.

In some embodiments, a design problem statement comprises at least one function problem statement, at least one objective problem statement, and at least one constraint problem statement. In these embodiments, the design problem statement comprises a constrained optimization problem for maximizing or minimizing a specified property of the design while not violating at least one specified constraint. In these embodiments, the design solution comprises a valid design solution satisfying all constraints and an optimized design solution satisfying all objectives for the design problem statement. Thus, the system and methods described herein has the ability to provide not just valid design solutions, but also an optimized design solution.

In sum, a UI engine on a computing device 110 is configured to receive a design problem statement from a user/designer that describes a design problem. The design problem statement comprises a set of problem statements. The problem statements are expressed in a CNL that specifies lexicons and syntax structures permitted for the problem statements. The lexicons are stored on a lexicon database 300 and the syntax structures are stored on a syntax database 200. A CNL engine 150 determines if the design problem statement is compliant with the lexicons and syntax structures of the CNL. If so, the CNL engine 150 processes (tokenizes and parses) problem statements of the design problem statement using the lexicon database 300 and syntax database 200 to produce a parsed representation of the design problem statement, the parsed representation comprising a design problem model. Based on the design problem model, the CNL engine 150 then produces an executable job description that is executable by a design engine 160 to produce a design solution for the design problem statement. The design solution comprises a solution for a design problem that is specified in the design problem statement. The design engine 160 may comprise a design application, such as a computer-aided design (CAD) application, computer-aided engineering (CAE) application, simulator application, modeler application, geometry generator application, or the like. In some embodiments, the design problem statement comprises a constrained optimization problem for maximizing or minimizing a specified property of the design while not violating at least one specified constraint. In these embodiments, the design solution comprises a valid design solution satisfying all constraints and an optimized design solution satisfying all objectives for the design problem statement. Thus, the system and methods described herein has the ability to provide not just valid design solutions, but also an optimized design solution.

At least one advantage of the disclosed technique is that the CAD system can receive, in CNL, a design problem statement specifying goals and intentions for a design solution and then produce the design solution, without the designer having to initially produce the design solution. The CNL defines terms of the lexicons and syntax structures which are the only terms and syntax structures permitted and accepted in the problem statements. By limiting the lexicons and syntax structures permitted in the problem statements, the ambiguity and computational complexity can be significantly reduced when processing the problem statements, as compared to processing problem statements that permit all of a natural language without restriction. Also, users/designers only need to learn the allowed lexicons and syntax structures defined by the CNL, instead of an entirely new input interface and method, thereby reducing complexity and increasing ease-of-use.

User Interface for CNL

The UI engine 140 of FIG. 1 generates a basic user interface that receives, from a user, a design problem statement expressed in CNL. However, as discussed in relation to steps 410-430 of FIG. 4, if the received design problem statement is not complaint with either the syntax structures or lexicons of the CNL, the user must resubmit a new design problem statement until CNL compliance is verified. For users not proficient in the syntax structures and/or lexicons of the CNL, this process may require several attempts by the user before a valid design problem statement is received. As used herein, a "valid" design problem statement or problem statement comprises a design problem statement or problem statement that is CNL-compliant (i.e., complies with the syntax structures and lexicons of the CNL thus would be verified as CNL-compliant in steps 420-430 of FIG. 4). Thus, a user interface that assists users to produce a valid design problem statements more effectively is needed.

In some embodiments, a CNL UI engine generates an improved CNL-specific user interface (CNL user interface) that assists users to produce valid design problem statements that are CNL-compliant. The CNL user interface may provide assistance to users in choosing user-selectable terms that are compliant with the CNL lexicons. Based on the user-selectable terms that are chosen, the CNL user interface may then generate a set of candidate problem statements that are each compliant with the CNL syntax structures. Each candidate problem statement will thus be compliant with CNL lexicons and CNL syntax structures. Optionally, the CNL user interface may also generate, based on a probabilistic grammar induction model, a probability score for each candidate problem statement reflecting a probability level that the particular candidate problem statement is the problem statement that the user intended. From the set of candidate problem statements, the user may then select a candidate problem statement to be included in the design problem statement. This process may be repeated as necessary to produce a set of problem statements comprising the design problem statement. Since each problem statement in the set will be CNL-compliant, the design problem statement will also be CNL-compliant.

Thus, the user would only need to choose user-selectable terms that are compliant with the CNL lexicons (a task which the CNL user interface may also provide assistance in performing) and a candidate problem statement that the user intended. From the chosen user-selectable terms, the CNL user interface generates one or more candidate problem statements that are CNL-compliant from which the user chooses. The CNL user interface allows users not proficient in the lexicons and/or syntax structures of the CNL to easily produce a valid design problem statement with a fast learning curve.

Figure 5:
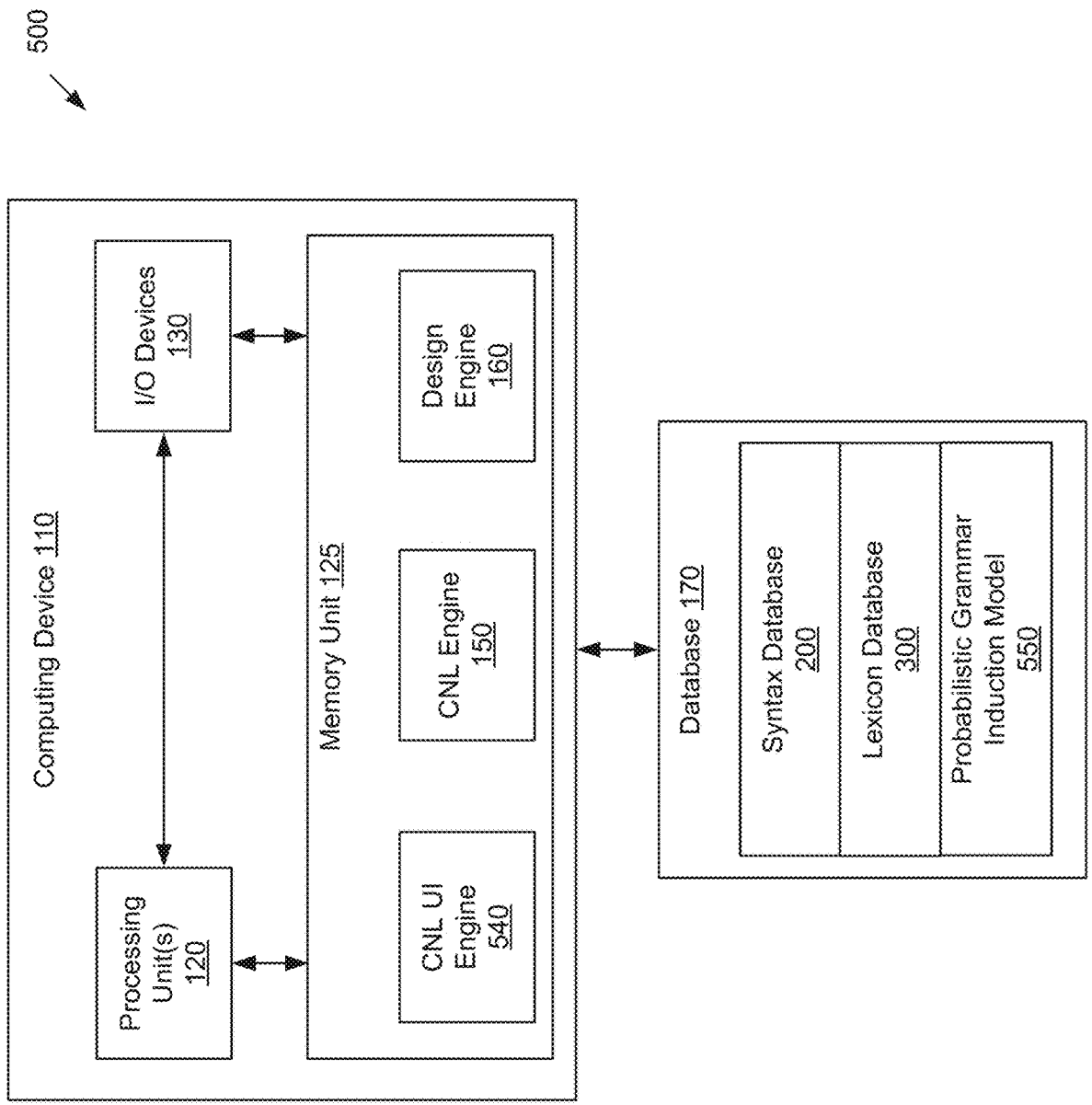
FIG. 5 illustrates another system configured to implement one or more aspects of the present invention.

FIG. 5 illustrates another system configured to implement one or more aspects of the present invention. As shown, the system 500 includes, without limitation, a computing device 110 coupled to a database 170. Computing device 110 may be a server system, client system, workstation, a laptop computer, a tablet or hand-held device, or any other type of computing device. The system 500 may comprise a computer-aided design (CAD) system. Several components shown in FIG. 5 have already been described above in relation to FIG. 1 and, therefore, are not discussed in detail here.

Computing device 110 includes one or more processing units 120 coupled to input/output (I/O) devices 130 and to memory unit 125. Memory unit 125 includes a CNL user interface (UI) engine 540, a controlled natural language (CNL) engine 150, and a design engine 160. A user/designer may input text information, received by the CNL UI engine 540, by typing on a keyboard. In other embodiments, a user/designer may input audio information, received by the CNL UI engine 540, by speaking into a microphone. In these embodiments, the CNL UI engine 540 comprises speech recognition software to process the received speech audio and convert to text information.

Computing device 110 is coupled to the database 170 comprising a syntax database 200, lexicon database 300, and a probabilistic grammar induction model 550. In some embodiments, the CNL UI engine 540 generates an improved CNL user interface that assists users to produce valid design problem statements. The CNL user interface may do so using the syntax database 200, lexicon database 300, probabilistic grammar induction model 550, and techniques described in this section. The CNL engine 150 may receive the design problem statement produced by the CNL UI engine 540 and process the design problem statement to produce an executable job description using techniques described above in relation to FIGS. 1-4 of the previous section. Note that the design problem statement produced by the CNL UI engine 540 will be a valid design problem statement that is CNL-compliant, and thus avoids the user having to resubmit for design problem statements found to be invalid in steps 410-430 of FIG. 4. The design engine 160 may receive the executable job description to produce a design solution for the design problem statement using techniques described above in relation to FIGS. 1-4 of the previous section.

Figure 6:
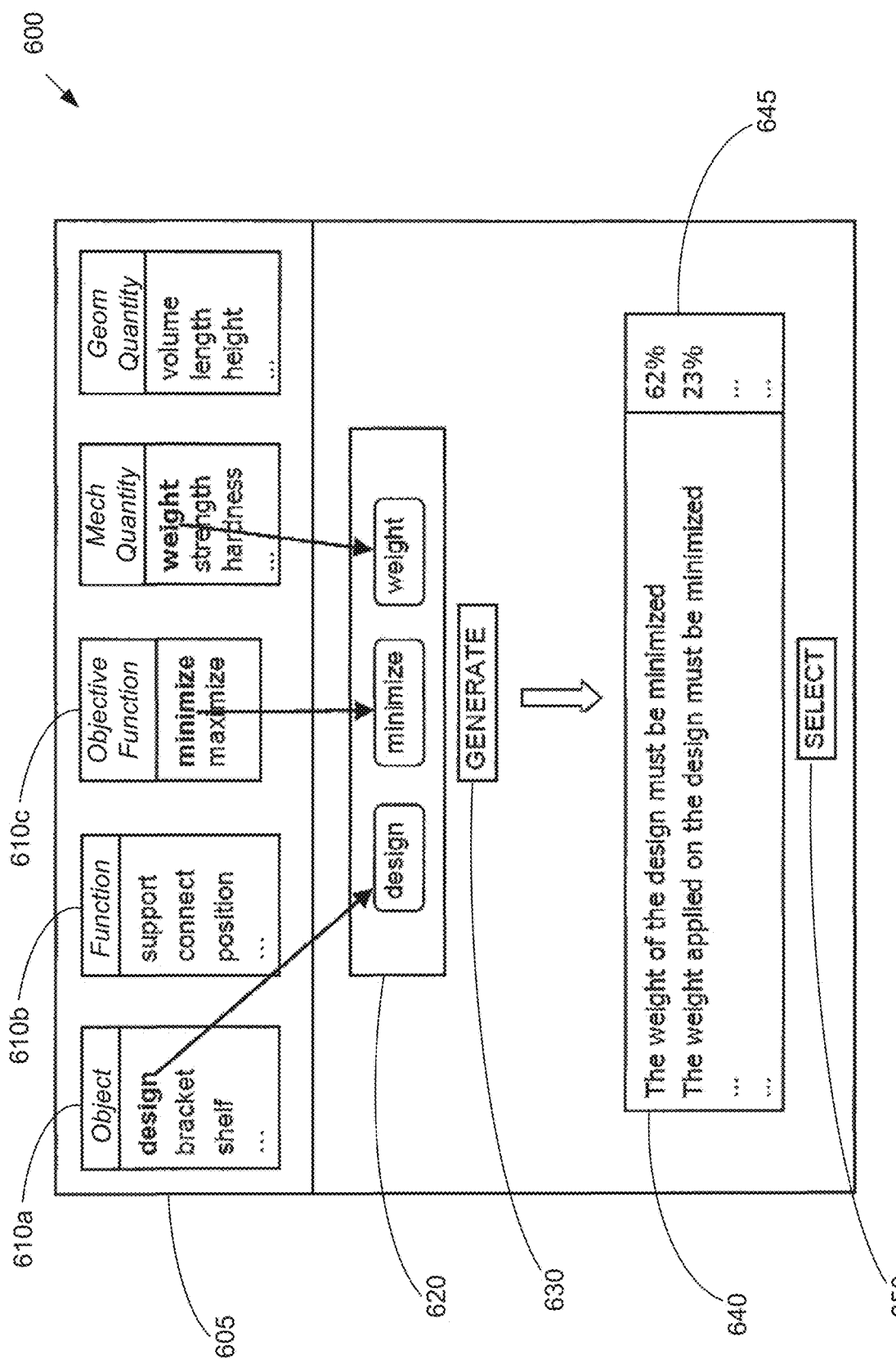
FIG. 6 shows an exemplary screenshot of a CNL user interface generated by the CNL UI engine of FIG. 5, according to one embodiment of the present invention.

As shown in FIG. 6, the CNL user interface 600 may comprise several interactive sections and selectable buttons, including a lexicon section 605, term input section 620, "generate" button 630, candidate problem statements (CPS) section 640, and a "select" button 650. The CNL user interface 600 may receive input or and selections from a user/designer through various ways, such as speech or typed input.

The lexicon section 605 may display different types of user-selectable terms 610 (e.g., Object 610*a*, Function 610*b*, ObjectiveFunction 610*c*, etc.). For each type of user-selectable term 610, the lexicon section 605 may display the type name and the permitted terms for the type of user-selectable term as defined by the CNL and stored to the lexicon database 300. The different types of user-selectable terms and the permitted terms for each type are discussed in relation to the lexicon database 300 of FIG. 3. (which shows as examples Object 310, Function 320, ObjectiveFunction 330, MechQuantity 340, GeomQuantity 350, MathOperator 360, and Num Value 370).

The term input section 620 may receive as input a set of one or more user-selectable terms from the user and display the received user-selectable terms. For example, the user may "drag and drop" user-selectable terms displayed in the lexicon section 605 into the term input section 620 (by selecting a term in the lexicon section 605 and dragging and dropping the term into the term input section 620 using a mouse or touchscreen). For example, the user may "drag and drop" user-selectable terms displayed in the lexicon section 605 into the term input section 620 (by selecting a term in the lexicon section 605 and dragging and dropping the term into the term input section 620). The "drag and drop" operation is conceptually illustrated in FIG. 6 by the arrowed lines. As another example, the user may type the text of the user-selectable terms directly into the term input section 620 using a keyboard. As a further example, the user may speak the user-selectable terms which are converted to text by speech recognition software and displayed in the term input section 620.

The user intends to express a particular problem statement by inputting the set of user-selectable terms, the problem statement for specifying a particular aspect of a design problem and/or design solution. The set of received user-selectable terms may form a portion of a problem statement that is later completed by the user and the CNL user interface. In particular, the set of received user-selectable terms forms the lexicon portion of the particular problem statement that the user intends, and the user and the CNL user interface later form the syntax portion of the particular problem statement. After inputting one or more user-selectable terms into the term input section 620 and the user is satisfied with the received terms, the user selects the "generate" button 630 which activates the CNL user interface 600 to generate a set of one or more candidate problem statements that are displayed in the CPS section 640. The CNL user interface 600 may generate the set of candidate problem statements based on the received user-selectable terms and the syntax structures defined by the CNL and stored to the syntax database 200. For example, the CNL user interface 600 may compare the received user-selectable terms with the CNL syntax structures to generate the set of candidate problem statements.

The CNL user interface 600 may also generate, based on a probabilistic grammar induction model 550, a probability score for each candidate problem statement reflecting a probability level that the particular candidate problem statement is the problem statement that the user intended. The determined probability for each candidate problem statement may be displayed in a probability section 645 of the CPS section 640. The probabilistic grammar induction model may take a set of words as input. As output, the probabilistic grammar induction model estimates the probability that a particular statement is relevant to those set of words. The probabilistic grammar induction model may estimate the probability for all possible statements but select only the statements with the highest probabilities. The probabilistic grammar induction model may be trained to estimate the probabilities using a machine learning algorithm or statistical modeling algorithm, based on some training data specified by designers. The training data may comprise problem statements paired with a set of lexicons. The specific training method may vary (e.g., logistic regression, neural network, Bayesian network).

Each candidate problem statement comprises a valid problem statement that is CNL-compliant (i.e., complies with the syntax structures and lexicons of the CNL). Each candidate problem statement is a suggestion/inference of the problem statement that the user intended by the received user-selectable terms. In other words, each candidate problem statement comprises a suggestion of a problem statement that is intended by the received user-selectable terms. The user then selects one of the candidate problem statements displayed in the CPS section 640. For example, the user may select a candidate problem statement by double-clicking on the candidate problem statement in the CPS section 640. Or the user may select a candidate problem statement by single-clicking on the candidate problem statement to highlight the candidate problem statement in the CPS section 640 and then clicking on the "select" button 650. The selected candidate problem statement is then added to a design problem statement.

The above process may be repeated to input additional sets of user-selectable terms and add more candidate problem statements to the design problem statement as needed until the user is satisfied with the design problem statement. The design problem statement may then be received and processed by the CNL engine 150 to produce an executable job description. Note that since each problem statement in the design problem statement is CNL-compliant, the design problem statement will also be CNL-compliant and thus would be verified as CNL-compliant by the CNL engine 150 in steps 420-430 of FIG. 4.

Figure 7:
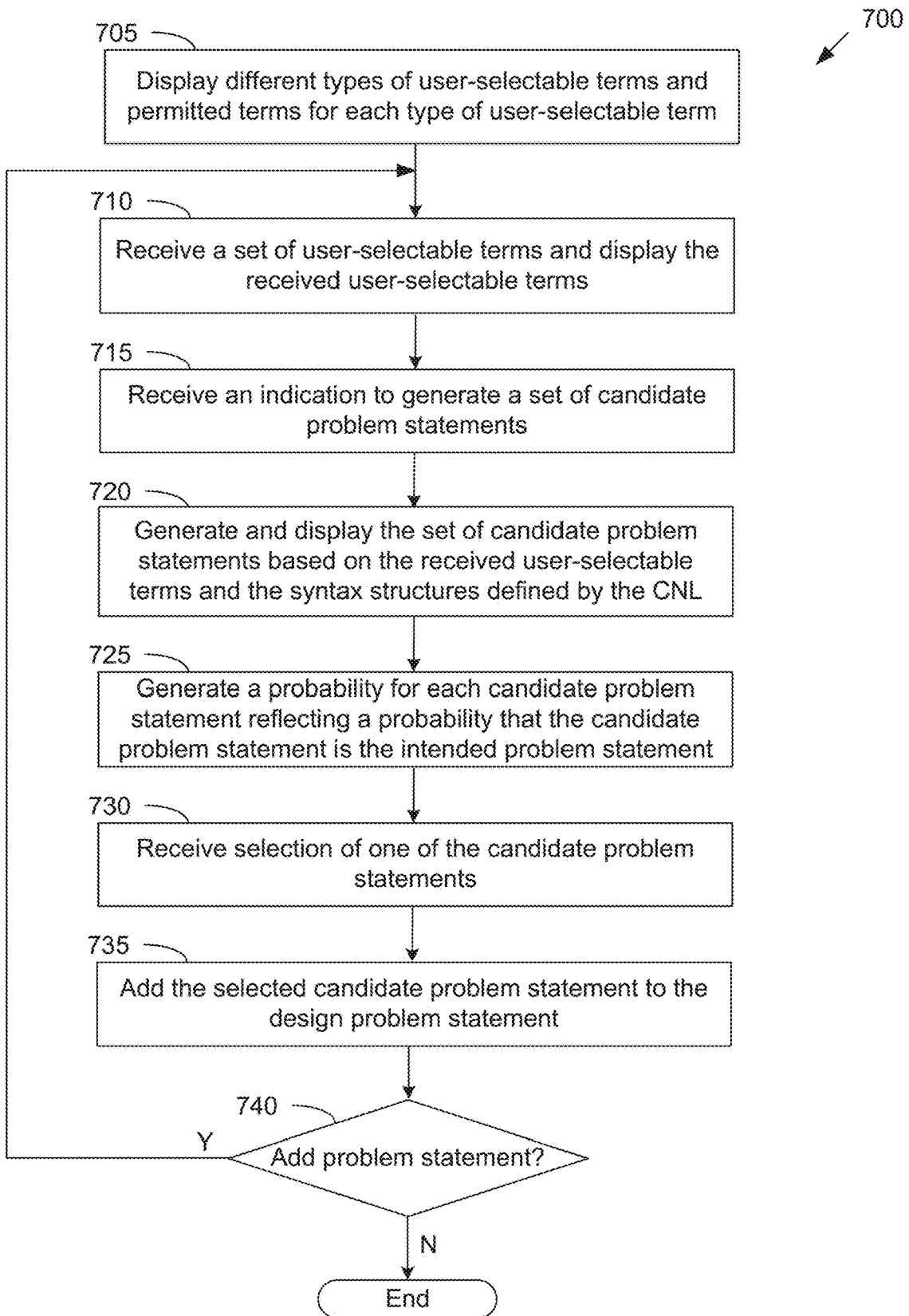
FIG. 7 illustrates a flow diagram of method steps for generating a valid design problem statement that is CNL-compliant, according to one embodiment of the present invention.

FIG. 7 illustrates a flow diagram of method steps for generating a valid design problem statement that is CNL-compliant, according to one embodiment of the present invention. Although the method steps are described in conjunction with the systems of FIG. 5-6, persons skilled in the art will understand that any system configured to perform the method steps, in any order, is within the scope of the present invention.

As shown, a method 700 begins at step 705, where the CNL UI engine 540, when executed by processing unit 120, produces a CNL user interface 600 that displays different types of user-selectable terms and permitted terms for each type of user-selectable term, as defined by the CNL and stored to the lexicon database 300. The different types of user-selectable terms and the permitted terms for each type may be retrieved from the lexicon database 300 and displayed in a lexicon section 605 of the CNL user interface 600. For example, as shown in FIG. 6, the lexicon section 605 may display the type name (such as "Object") and the permitted terms for the type (such as "design, bracket, shelf . . . ").

At step 710, the CNL user interface 600 receives a set of one or more user-selectable terms from the user and displays the received user-selectable terms. The received user-selectable terms comprise permitted terms of one or more different types of user-selectable terms. For example, as shown in FIG. 6, the received set of user-selected terms comprises the permitted term "design" which is an "Object" type, the permitted term "minimize" which is an "ObjectiveFunction" type, and the permitted term "weight" which is a "MechQuantity" type. The user-selectable terms may be received in a term input section 620 of the CNL user interface 600 (e.g., via "drag and drop" operations, typing the term, or speaking the terms) and displayed in the term input section 620. Note that the set of user-selectable terms may be received and displayed in any sequence. The user intends to express a particular problem statement by inputting the set of user-selectable terms, the problem statement for specifying a particular aspect of a design problem and/or design solution.

At step 715, the CNL user interface 600 receives an indication from the user to generate a set of candidate problem statements. For example, the CNL user interface 600 may receive a selection of a "generate" button 630 which activates the CNL user interface 600 to generate the set of candidate problem statements. In response, at step 720, the CNL user interface 600 generates and displays the set of candidate problem statements based on the received user-selectable terms and the syntax structures predefined for problem statements (the syntax structures defined by the CNL and stored to the syntax database 200). The CNL user interface 600 may display the set of candidate problem statements in the CPS section 640.

The CNL user interface 600 may generate the set of candidate problem statements in step 720 by comparing the received user-selectable terms with the syntax structures stored to the syntax database 200 to determine "matching" syntax structures. The set of candidate problem statements may be generated based on the matching syntax structures. Recall that the received user-selectable terms comprise one or more different types of user-selectable terms. Also, a syntax structure for a problem statement specifies the position and order of fixed terms and types of user-selectable terms within a problem statement. The CNL user interface 600 may determine the types of user-selectable terms for the received user-selectable terms, and identify any "matching" syntax structures that specify the same types of user-selectable terms. Thus, generating the set of candidate problem statements may comprise comparing the types of user-selectable terms of the received set of user-selectable terms with the types of user-selectable terms of the syntax structures of the CNL to determine matching syntax structures, which are then used to generate the set of candidate problem statements.

For example, as shown in FIG. 6, the received set of user-selected terms comprises the "Object" type, "ObjectiveFunction" type, and the "MechQuantity" type. Thus, any syntax structure that also specifies the "Object," "ObjectiveFunction," and "MechQuantity" types of user-selectable terms comprises a matching syntax structure. In some embodiments, the types of user-selectable terms specified in a matching syntax structure exactly overlap the types of user-selectable terms of the received user-selectable terms. For example, if the received user-selectable terms comprises type1, type2, and type3, a matching syntax structure also specifies only type1, type2, and type3. In these embodiments, a non-matching syntax structure may specify only type1 and type2, or a non-matching syntax structure may specify type1, type2, type3, and type4. In other embodiments, the types of user-selectable terms specified in a matching syntax structure do not exactly overlap the types of user-selectable terms of the received user-selectable terms.

To perform step 720, the CNL user interface 600 then generates a candidate problem statement for each matching syntax structure that is identified. The matching syntax structure provides the syntax/sentence structure of the candidate problem statement by specifying the position and order of fixed terms and types of user-selectable terms for the candidate problem statement. For example, a matching syntax structure may specify "the MechQuantity of the Object must be ObjectiveFunction," whereby MechQuantity, Object, and ObjectiveFunction are types of user-selectable terms. The CNL user interface 600 then inserts each received user-selectable term at the position of its corresponding type of user-selectable term within the candidate problem statement to complete the candidate problem statement. For example, as shown in FIG. 6, the received set of user-selected terms comprises the term "weight" which is inserted into the position of the "MechQuantity" type, the term "design" which is inserted into the position of the "Object" type, the term "minimize" which is inserted into the position of the "ObjectiveFunction" type within the candidate problem statement. The resulting candidate problem statement is thus "the weight of the design must be minimized" (as shown in the CPS section 640 of FIG. 6). As described above, the matching syntax structure provides the syntax/sentence structure for the candidate problem statement and the received user-selectable terms provide the user-selectable terms for the candidate problem statement. Thus, the syntax portion of the candidate problem statement is provided by the matching syntax structure and the lexicon portion of the candidate problem statement is provided by the received user-selectable terms.

At step 725, the CNL user interface 600 may also generate, based on the probabilistic grammar induction model 550, a probability for each candidate problem statement reflecting a probability that the particular candidate problem statement is the problem statement that the user intended. The determined probability for each candidate problem statement may be displayed in a probability section 645 of the CPS section 640. In some embodiments, the candidate problem statements may be displayed in the CPS section 640 in an order based on the determined probability (e.g., from highest to lowest probability).

Each candidate problem statement comprises a valid problem statement that is CNL-compliant. However, a candidate problem statement is only a suggestion of the problem statement that the user intended by the inputted user-selectable terms. At step 730, the CNL user interface 600 receives, from the user, a selection of one of the candidate problem statements in the set of candidate problem statements displayed in the CPS section 640. The selected candidate problem statement comprises the problem statement that the user intended from the inputted user-selectable terms. In response, at step 735, the CNL user interface 600 adds the selected candidate problem statement to the design problem statement.

At step 740, the CNL user interface 600 determines if another problem statement is to be added to the design problem statement. For example, the CNL user interface 600 may query the user if another problem statement is to be added to the design problem statement, and receive a "yes" or "no" response from the user. If the CNL user interface 600 determines that another problem statement is to be added to the design problem statement, the method 700 continues at step 710 to receive another set of user-selectable terms, generate another set of candidate problem statements, and add another problem statement to the design problem statement. If the CNL user interface 600 determines that another problem statement is not to be added to the design problem statement, the method 700 ends.

The design problem statement produced by the method 700 may then be received and processed by the CNL engine 150 and the design engine 160 to produce an executable job description and a design solution in accordance with the method 400 of FIG. 4. Note that since each problem statement in the design problem statement set is CNL-compliant, the design problem statement is also CNL-compliant and thus would be verified as CNL-compliant by the CNL engine 150 in steps 420-430 of FIG. 4. In other embodiments, steps 420-430 of FIG. 4 are omitted and not performed when processing a design problem statement produced by the method 700 of FIG. 7.

In sum, a CNL UI engine 540 generates an improved CNL-specific user interface (CNL user interface 600) that assists users to produce valid design problem statements that are CNL-compliant. The CNL user interface may provide assistance to users in choosing user-selectable terms that are compliant with the CNL lexicons. Based on the user-selectable terms that are chosen, the CNL user interface may then generate a set of candidate problem statements that are compliant with the CNL syntax structures. Each candidate problem statement will thus be compliant with CNL lexicons and CNL syntax structures. Optionally, the CNL user interface may also generate, based on a probabilistic grammar induction model, a probability for each candidate problem statement reflecting a probability that the particular candidate problem statement is the problem statement that the user intended. From the set of candidate problem statements, the user may then select a candidate problem statement to be included in the design problem statement. This process may be repeated as necessary to produce a set of problem statements comprising the design problem statement. Since each problem statement in the set will be CNL-compliant, the design problem statement will also be CNL-compliant. The produced design problem statement may then be processed by the CNL engine 150 and the design engine 160 to produce an executable job description and a design solution to the produced design problem statement.

At least one advantage of the disclosed technique is that the CNL user interface allows users not proficient in the lexicons and/or syntax structures of the CNL to easily and more effectively produce a valid design problem statement. A user would only need to choose user-selectable terms that are compliant with the CNL lexicons (a task which the CNL user interface may also provide assistance in performing). From the chosen user-selectable terms, the CNL user interface generates a set of candidate problem statements that are CNL-compliant from which the user chooses to add to the design problem statement. Thus, users can input valid design problem statements without or with minimum CNL training.

Graphical User Interface for CNL

As discussed in the previous sections, the method 400 of FIG. 4 (e.g., steps 410-430) and the method 700 of FIG. 7 provide different techniques for generating a design problem statement that is valid/CNL-compliant. However, even if a design problem statement is valid, as a whole, the valid design problem statement may not reflect the design problem statement that the user actually intended/envisioned (the "intended design problem statement"). As described in relation to steps 440-460 of FIG. 4, a valid design problem statement is processed (tokenized and parsed) to produce a design problem model, which is then converted into an executable job description that is executed by a design application to produce a design solution to the design problem statement. However, if the design problem statement is not what was actually intended by the user, this may not be realized until the design solution is produced. Thus, the entire process may need to be performed again until the intended design problem statement and intended design solution are produced. This process may require several attempts by the user which is inefficient in terms of time and processing resources. Thus, a user interface that assists users to produce an intended design problem statements more effectively is needed.

In some embodiments, a CNL graphical user interface (UI) engine implements a faster and more efficient way for the user to immediately confirm whether a design problem statement is actually the intended design problem statement. In these embodiments, CNL graphical UI engine generates a graphical user interface that assists users to produce intended design problem statements. The graphical user interface may implement a graphical representation of the design problem statement prior to conversion to an executable job description. In particular, the graphical user interface may implement a graphical representation based on the parsed representation of the design problem statement (the design problem model) prior to conversion to an executable job description. As used herein, a graphical representation of the design problem model also refers to a graphical representation of the design problem statement, and these phrases may be used interchangeably.

The graphical representation may implement a visualization of the design problem statement/model by displaying graphical representations of objects and relationships between the objects as specified in the design problem statement. The graphical representation is displayed to the user via the graphical user interface. If the user is unsatisfied with the displayed visualization of the design problem statement, the user may directly modify the graphical representation via the graphical user interface. Any modifications to the graphical representation will modify the design problem statement accordingly (via modification of the design problem model). If the user is satisfied with the displayed visualization of the design problem statement, the intended design problem statement/model is then converted to an executable job description.

Thus, the graphical user interface provides immediate visual feedback of the received design problem statement to verify that the received design problem statement is the intended design problem statement before conversion to an executable job description, thereby saving time and processing resources.

Figure 8:
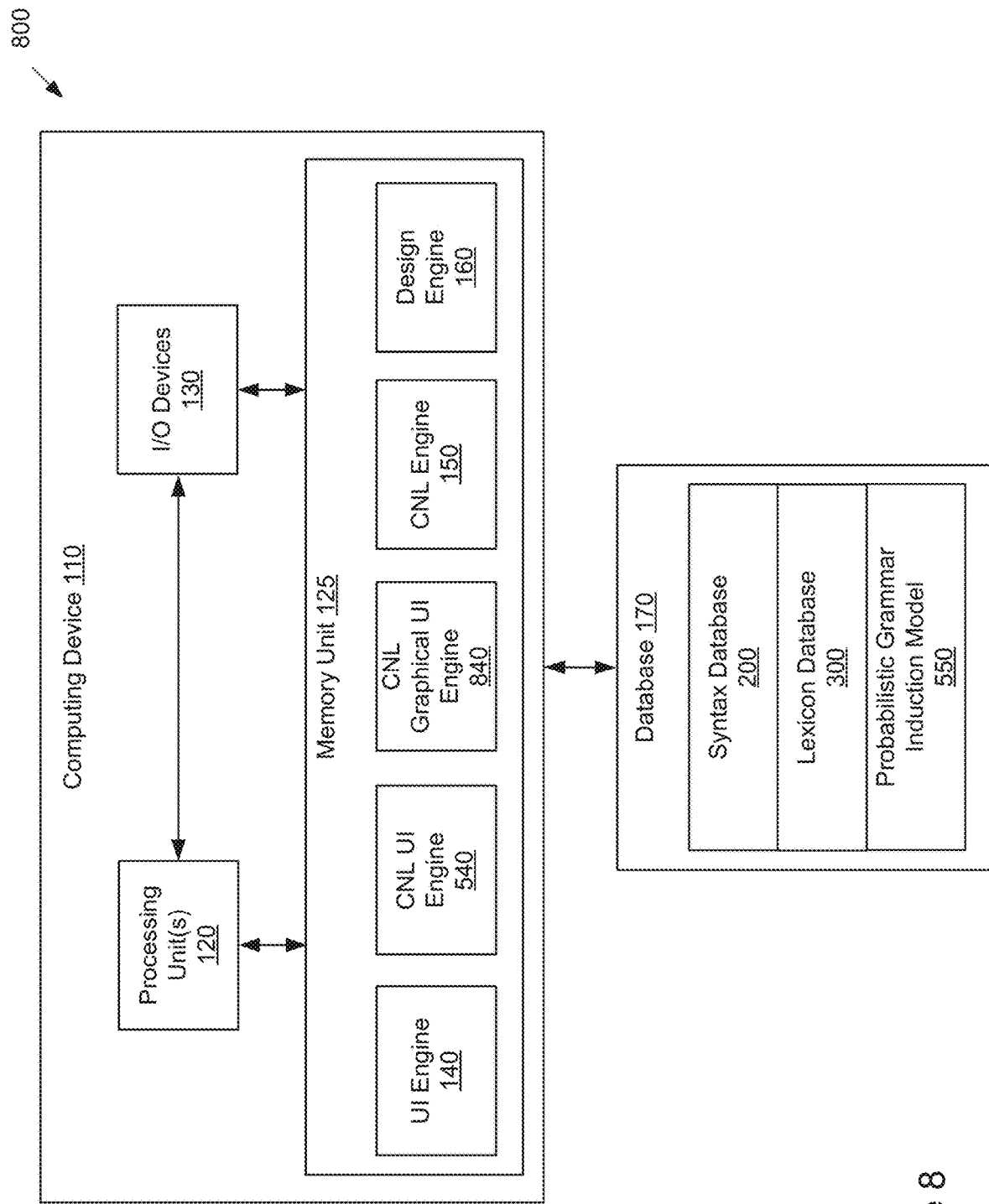
FIG. 8 illustrates yet another system configured to implement one or more aspects of the present invention.

FIG. 8 illustrates yet another system configured to implement one or more aspects of the present invention. As shown, the system 800 includes, without limitation, a computing device 110 coupled to a database 170. Computing device 110 may be a server system, client system, workstation, a laptop computer, a tablet or hand-held device, or any other type of computing device. The system 800 may comprise a computer-aided design (CAD) system. Several components shown in FIG. 8 have already described above in relation to FIGS. 1 and 5 and, therefore, are not discussed in detail here.

Computing device 110 includes one or more processing units 120 coupled to input/output (I/O) devices 130 and to memory unit 125. Memory unit 125 includes a UI engine 140, a CNL UI engine 540, a CNL graphical UI engine 840, a controlled natural language (CNL) engine 150, and a design engine 160. A user/designer may input text information, received by the CNL graphical UI engine 840, by typing on a keyboard. In other embodiments, a user/designer may input audio information, received by the CNL graphical UI engine 840, by speaking into a microphone. In these embodiments, the CNL graphical UI engine 840 comprises speech recognition software to process the received speech audio and convert to text information. Computing device 110 is coupled to the database 170 comprising a syntax database 200, lexicon database 300, and a probabilistic grammar induction model 550.

In some embodiments, the CNL graphical UI engine 840 generates a graphical user interface that assists users to produce intended design problem statements. The CNL engine 150 may receive an intended design problem statement and process the intended design problem statement to produce an executable job description using techniques described above in relation to FIGS. 1-4 of the previous section. The design engine 160 may receive the executable job description to produce a design solution for the intended design problem statement using techniques described above in relation to FIGS. 1-4 of the previous section.

Figure 9:
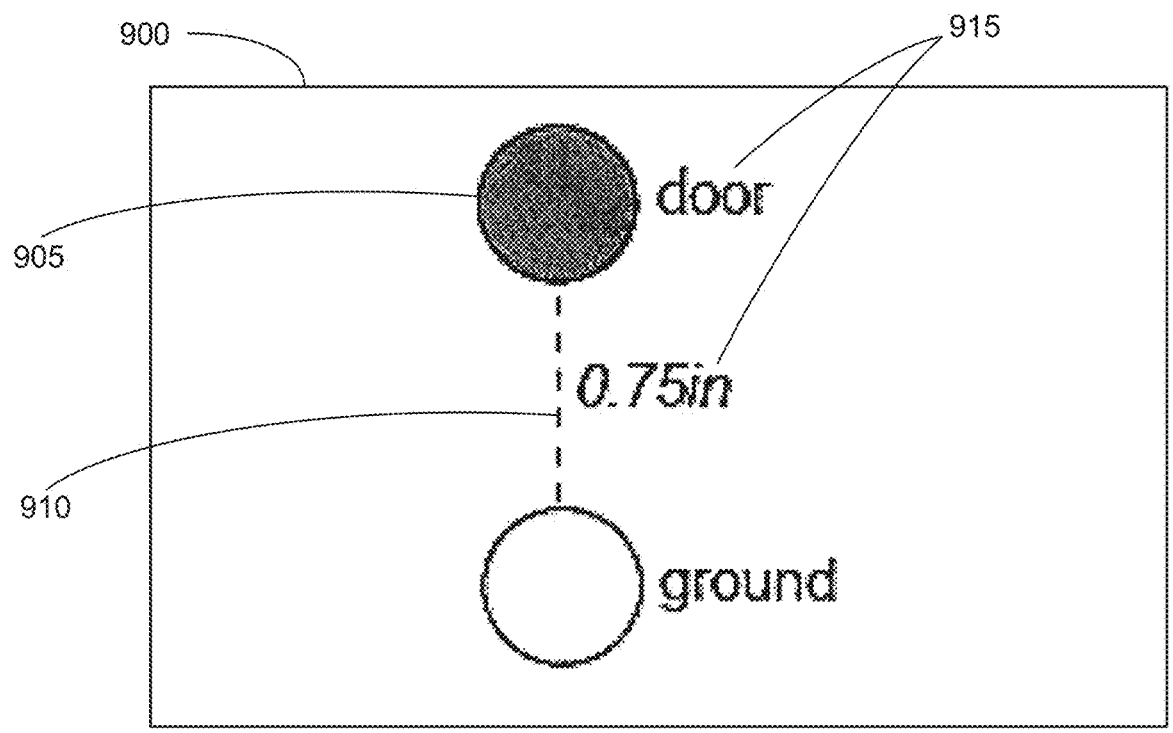
FIG. 9 shows a first exemplary screenshot of a graphical user interface generated by the CNL graphical UI engine of FIG. 8, according to one embodiment of the present invention.

FIG. 9 shows a first exemplary screenshot 900 of a graphical user interface generated by the CNL graphical UI engine 840 of FIG. 8, according to one embodiment of the present invention. The first exemplary screenshot 900 shows a graphical representation of a design problem statement comprising a problem statement specifying "the clearance between the door and the ground must be 0.75 in." Thus, the graphical user interface shows graphical representations of objects comprising "door" and "ground" and a spatial clearance relationship between the two objects.

The graphical user interface may produce the graphical representation of the design problem statement based on the design problem model of the design problem statement. As discussed in relation to step 450 of FIG. 4, the design problem model is a parsed representation of each problem statement of the design problem statement. The parsed representation of a problem statement may comprise the type of problem statement (e.g., function, objective, constraint, etc.), a list of object names, and relationships between the objects. The graphical user interface may display graphical representations of objects and relationships between the objects as specified in the problem statements of the design problem statement. The graphical representation may comprise formal graph data that describes the graphical representations of the objects and relationships.

Figure 11:
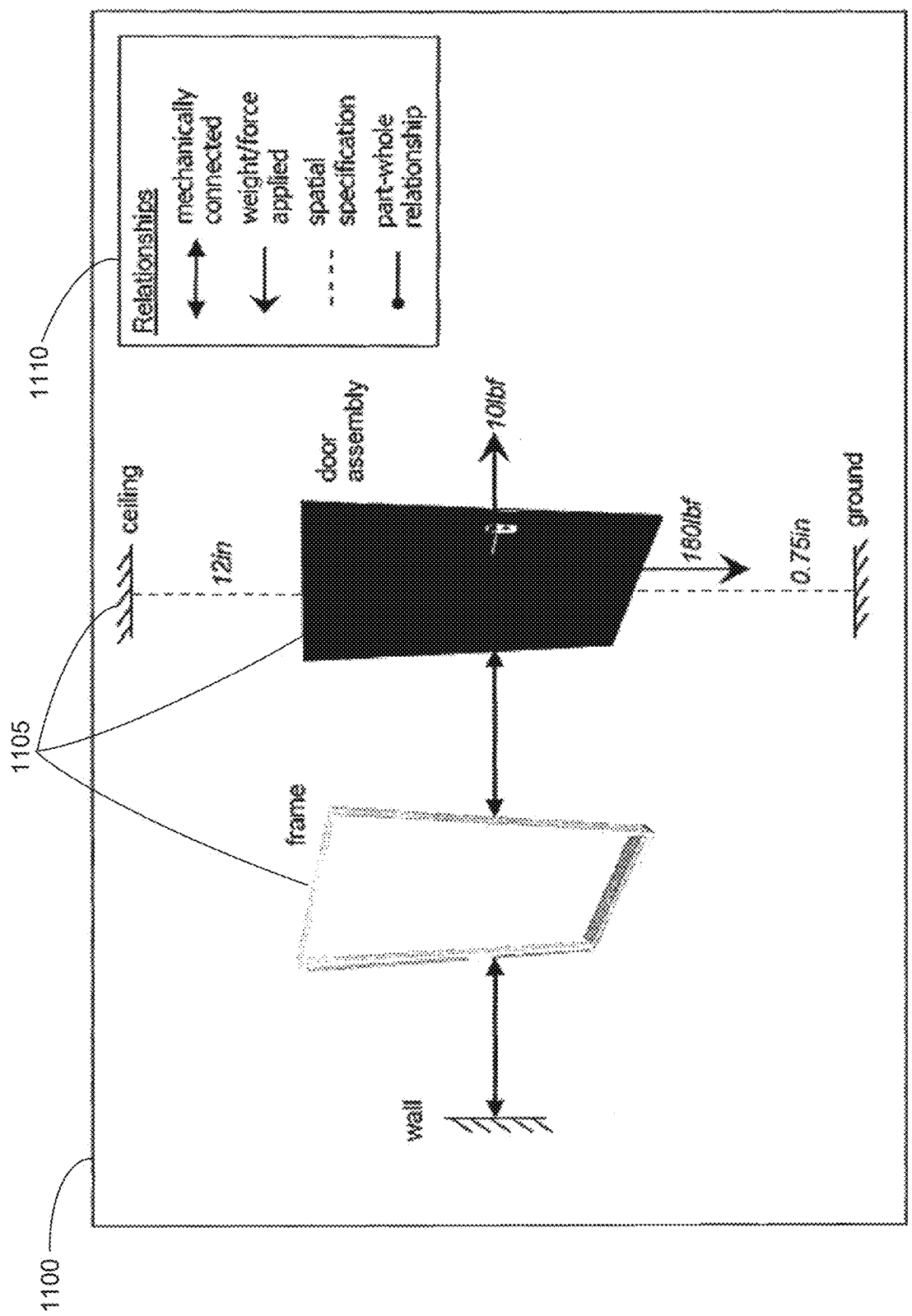
FIG. 11 shows a third exemplary screenshot of a graphical user interface generated by the CNL graphical UI engine of FIG. 8, according to one embodiment of the present invention.

In some embodiments, the graphical user interface may graphically represent an object with a node 905 comprising a graphic illustration. In the example of FIG. 9, the graphic illustration for a node comprises a conventional circle. In other embodiments, the graphic illustration for a node may comprise any other illustration (as shown in the example of FIG. 11). The graphical user interface may display the nodes in positions in the graphical user interface so as to indicate relative spatial positions between the objects that are represented by the nodes. For example, the "door" node is placed above the "ground" node in the graphical user interface.

In some embodiments, the graphical user interface may graphically represent a relationship between two objects with an edge 910 comprising a graphic illustration. In the example of FIG. 9, the graphic illustration for an edge comprises a line. In other embodiments, the graphic illustration for an edge may comprise any other illustration. An edge or line representing a relationship may be displayed in different forms or appearances to indicate different types of relationships. In the example of FIG. 9, the dashed line/edge indicates a spatial relationship.

The graphical user interface may also display text 915 that identifies names of the objects represented by the nodes. In the example of FIG. 9, the shaded node represents a "door" object and the unshaded node represents a "ground" object. The graphical user interface may also display text 915 for a numerical value associated with a relationship. In the example of FIG. 9, the spatial relationship between the "door" object and the "ground" object is "0.75 in."

Figure 10:
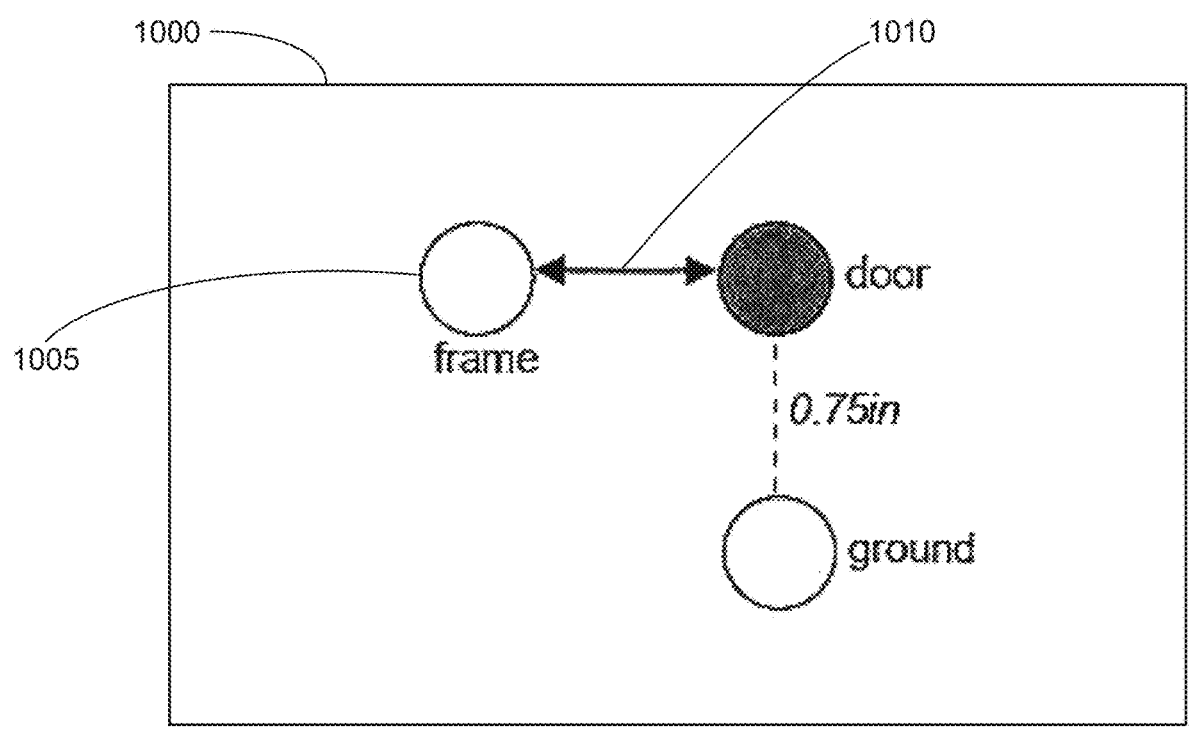
FIG. 10 shows a second exemplary screenshot of a graphical user interface generated by the CNL graphical UI engine of FIG. 8, according to one embodiment of the present invention.

FIG. 10 shows a second exemplary screenshot 1000 of a graphical user interface generated by the CNL graphical UI engine 840 of FIG. 8, according to one embodiment of the present invention. The second exemplary screenshot 1000 shows a graphical representation of a design problem statement comprising the problem statement of FIG. 9 in addition to a new problem statement specifying "the door must be connected to a frame." As shown in FIG. 10, the graphical user interface displays an additional node 1005 representing the new "frame" object and an additional edge 1010 representing the new connection relationship between the "frame" object and the "door" object. In the example of FIG. 10, the mechanical connection relationship between the "frame" object and the "door" object is represented by a double-arrowed line.

FIG. 11 shows a third exemplary screenshot 1100 of a graphical user interface generated by the CNL graphical UI engine 840 of FIG. 8, according to one embodiment of the present invention. As shown in FIG. 11, the graphical user interface may graphically represent objects with nodes 1105 comprising graphic illustrations other than conventional circles. The graphic illustrations for nodes may comprise two-dimensional (2D) or three-dimensional (3D) illustrations that visually resemble the represented object. For example, the "frame" and "door" objects may be represented by illustrations resembling the objects. The graphic illustrations for nodes may also comprise symbol icons that are commonly used to represent the object. For example, the "wall," "ceiling," and "ground" objects may be represented by commonly used symbol icons representing these objects. As shown in FIG. 11, the nodes may be displayed in positions in the graphical user interface so as to indicate relative spatial positions between the objects that are represented by the nodes.

Edges may have different forms/appearances indicating different types of relationships so that an edge has a particular appearance depending on the type of relationship the edge represents. As shown in FIG. 11, the graphical user interface may also display a relationship legend 1110 specifying a plurality of different types of relationships and an edge form/appearance that represents each type of relationship. For example, a mechanical connection relationship may be represented by a double-arrowed line, an applied weight/force relationship may be represented by a single-arrowed line, a spatial relationship may be represented by a dashed line, and a part-whole relationship may be represented by a dot-ended line.

If the user is unsatisfied with the visualization of the design problem statement displayed in the graphical user interface, the user may directly modify the graphical representation through the graphical user interface. The user may directly modify the graphical representations of the objects and relationships within the graphical user interface. The user may modify the position of nodes and edges within the graphical user interface, for example by selecting and dragging nodes and edges with a mouse or touchscreen interface. The user can may also modify the text for the name of an object, e.g., by clicking on the node representing the object and typing in the new name of the object. The user can may also modify the text for a numerical value associated with a relationship, e.g., by clicking on the edge representing the relationship and typing in the new numerical value associated with the relationship. The user may also modify the graphical representation by deleting a node representing an object or deleting an edge representing a relationship. The user may also modify the graphical representation by adding new nodes representing new objects, e.g., by double-clicking in an empty space of the graphical user interface to create a new node representing the object and inputting text for the object name. The user may also modify the graphical representation by adding new edges representing new relationships, e.g., by right-click and drag-and-drop from one node to another node and inputting text specifying the type of relationship and any numerical value associated with the relationship.

Any modifications to the graphical representation may modify the design problem statement accordingly. In particular, the modifications to the graphical representation may modify the design problem model (that is a parsed representation of the design problem statement), which effectively modifies the design problem statement. As discussed in relation to step 450 of FIG. 4, the design problem model is a parsed representation of each problem statement of the design problem statement. The parsed representation of a problem statement may comprise the type of problem statement (e.g., function, objective, constraint, etc.), a list of object names, and relationships between the objects. Modifications of objects or relationships displayed in the graphical representation will accordingly modify the parsed representations of the problem statements of the design problem statement, which effectively modifies the design problem statement.

Figure 12:
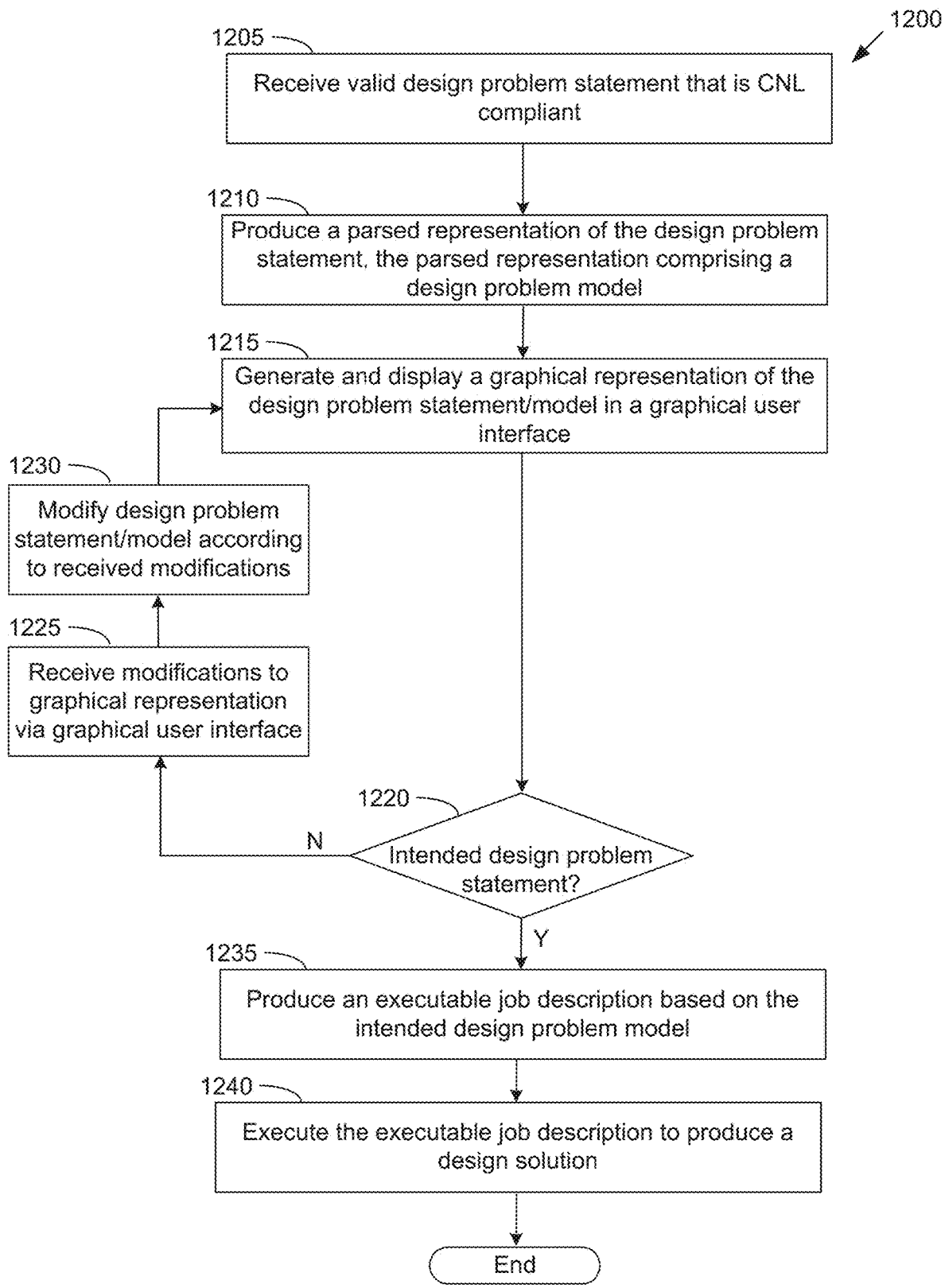
FIG. 12 illustrates a flow diagram of method steps for generating an intended design problem statement that is CNL-compliant, according to one embodiment of the present invention.

FIG. 12 illustrates a flow diagram of method steps for generating an intended design problem statement that is CNL-compliant, according to one embodiment of the present invention. Although the method steps are described in conjunction with the systems of FIG. 8-11, persons skilled in the art will understand that any system configured to perform the method steps, in any order, is within the scope of the present invention.

As shown, a method 1200 begins at step 1205, where the CNL engine 150, when executed by processing unit 120, receives a valid design problem statement that is CNL-compliant. For example, the valid design problem statement may be produced using steps 410-430 of FIG. 4 or by using the method 700 of FIG. 7. At step 1210, the CNL engine 150 processes (tokenizes and parses) the design problem statement using the lexicon database 300 and syntax database 200 to produce a parsed representation of the design problem statement, the parsed representation comprising a design problem model. Step 1210 comprises steps 440-450 of FIG. 4 and is not discussed in detail here.

At step 1215, the CNL graphical UI engine 840 receives the design problem model and generates and displays a graphical representation of the current design problem statement/model in a graphical user interface. Note that the graphical representation of the design problem model also comprises a graphical representation of the design problem statement. The graphical representation may generate a visualization of the design problem statement/model by displaying graphical representations of objects and relationships between the objects as specified in the design problem statement/model. The graphical representation may comprise formal graph data that describes the graphical representations of the objects and relationships. The graphical user interface may graphically represent an object with a node and a relationship with an edge. The graphical user interface may further display text for object names or numerical values associated with a relationship. The graphical user interface may additionally display a legend specifying different types of relationships and an edge appearance that represents each type of relationship.

At step 1220, the CNL graphical UI engine 840 determines if the user is satisfied with the graphical representation of the current design problem statement/model (i.e., that it is the intended design problem statement/model). For example, the graphical user interface may receive a selection of an interactive button or particular text/speech that indicates the user wants to proceed with converting the current design problem statement/model to an executable job description. If the CNL graphical UI engine 840 determines that the user is satisfied with the graphical representation of the current design problem statement/model, method 1200 continues at step 1235. If the CNL graphical UI engine 840 determines that the user is not satisfied with the graphical representation of the current design problem statement/model, method 1200 continues at step 1225.

At step 1225, the CNL graphical UI engine 840 receives one or more modifications to the graphical representation of the current design problem statement/model. The modifications to the graphical representation may be received directly through the graphical user interface. For example, the user may directly modify the graphical representations of the objects and relationships and any text displayed within the graphical user interface (e.g., modifying the position of nodes representing objects and edges representing relationships, modifying text for object names or numerical values associated with relationships, adding new nodes representing new objects, adding new edges representing new relationships, etc.).

At step 1230, the CNL graphical UI engine 840 modifies the current design problem statement/model according to the received one or more modifications to the graphical representation of the current design problem statement/model. The CNL graphical UI engine 840 may do so by modifying the current design problem model comprising parsed representations of the problem statements of the design problem statement. The modifications to the current design problem model effectively modifies the current design problem statement as well. The method 1200 then continues at step 1215 where the CNL graphical UI engine 840 generates and displays a graphical representation of the modified design problem statement/model in the graphical user interface. Steps 1215-1230 continually repeat until the user is satisfied with the graphical representation at step 1220.

If the user is satisfied with the graphical representation of the current design problem statement/model it is considered the intended design problem statement/model. At step 1235, the CNL engine 150 produces an executable job description based on the intended design problem model. Step 1235 comprises step 460 of FIG. 4 and is not discussed in detail here. At step 1240, the design engine 160 executes the executable job description to produce a design solution. Step 1240 comprises step 470 of FIG. 4 and is not discussed in detail here. The method 1200 then ends.

In sum, a CNL graphical UI engine 840 on a computing device 110 is configured to generate a graphical user interface that assists users to develop intended design problem statements that reflect the design problem statement that the user intends/envisions. The graphical user interface displays a graphical representation of a design problem statement/model. The graphical representation may generate a visualization of the design problem statement/model by displaying graphical representations of objects and relationships between the objects as specified in the design problem statement/model. The graphical user interface may graphically represent an object with a node and a relationship with an edge. The graphical user interface may further display text for object names or numerical values associated with a relationship. The CNL graphical UI engine 840 may receive modifications to the graphical representation of the design problem statement/model directly through the graphical user interface. In response, the CNL graphical UI engine 840 may modify the design problem statement/model accordingly. Once the user is satisfied with the graphical representation of the design problem statement/model, the design problem statement/model is considered the intended design problem statement/model. The CNL engine 150 then produces an executable job description based on the intended design problem model and the design engine 160 executes the executable job description to produce a design solution.

At least one advantage of the disclosed technique is that the graphical user interface generates a visualization of the design problem statement/model so the user can verify that the design problem statement/model is actually what the user intended. The graphical user interface generates immediate visual feedback of a design problem statement to verify that the design problem statement is the intended design problem statement before conversion to an executable job description, thus saving time and processing resources. Also, the user may easily make modifications to the design problem statement/model as needed by directly modifying the graphical representation through the graphical user interface.

Dialogue User Interface

As discussed in the previous section, the method 1200 of FIG. 12 provides a technique for generating an intended design problem statement. However, even if an intended design problem statement captures what the user/designer actually intended/envisioned, the intended design problem statement is still a reflection of the personal knowledge and experience of the user/designer. An intended design problem statement and any design solutions generated from that design problem statement may not fully explore other possible design problem statements and/or design solutions. Consequently, the generated design solutions may ultimately be limited by the designer's personal knowledge and experience.

In addition, the convention design process is usually a convergent process, rather than an exploratory process. For example, designers typically start with a conceptual idea about potential design solutions for a design problem and then move into more concrete and restrictive engineering cycles, during which the possible design solutions are reduced and narrowed down to a few design solutions which can be modeled, simulated, and optimized. Toward the late stage of the design process, new constraints may be added. But given the limited number of design solutions now available at this stage, compromises are typically made in realizing the final design solution, leading to a sub-optimal design. The convergent nature of the traditional design process may inherently limit the opportunity to find innovative and optimal design solutions. Conventional CAD systems are configured to follow this traditional convergent design process. Conventional CAD systems may assist users to model, simulate, and optimize the limited designs solutions that are available in the later stages of design.

As the foregoing illustrates, the design solutions generated by the conventional design process may be limited by the designer's personal knowledge and experience as well as the convergent nature of the conventional design process. Thus, a user interface that assists users to explore further design solutions is needed.

In some embodiments, a dialogue user interface (UI) engine provides a way for the user to more fully explore possible design intentions and design solutions. The dialogue UI engine may receive a user input comprising a design intention description that describes intentions and goals of a design problem and/or design solution. The design intention description may be in a variety of different forms, such as a CNL-compliant design problem statement. In these embodiments, the design intention description is compliant with a controlled natural language (CNL) that defines lexicons and syntax structures permitted in the design intention description. However, a design intention description may also take other forms, such as another natural-language based description, graphical representation of a design problem, or even a design solution from a design application (e.g., set of geometries, 3D model, etc.). The dialogue UI engine interprets the design intention description and may respond with suggestions of modifications to the design intention description and/or one or more suggested design solutions. Based on the suggestions, the user may respond with a modified design intention description, which the dialogue UI engine again interprets and responds with suggestions for modifications to the design intention description and/or suggested design solutions.

The dialogue UI engine implements a dialogue-based design process to more fully explore possible design intention descriptions and design solutions. The dialogue UI engine allows the user to interact with the dialogue UI engine in an iterative manner to discover design intention descriptions and/or design solutions not previously considered. The iterative dialogue-based design process may assist the user to find an optimal design solution.

Figure 13:
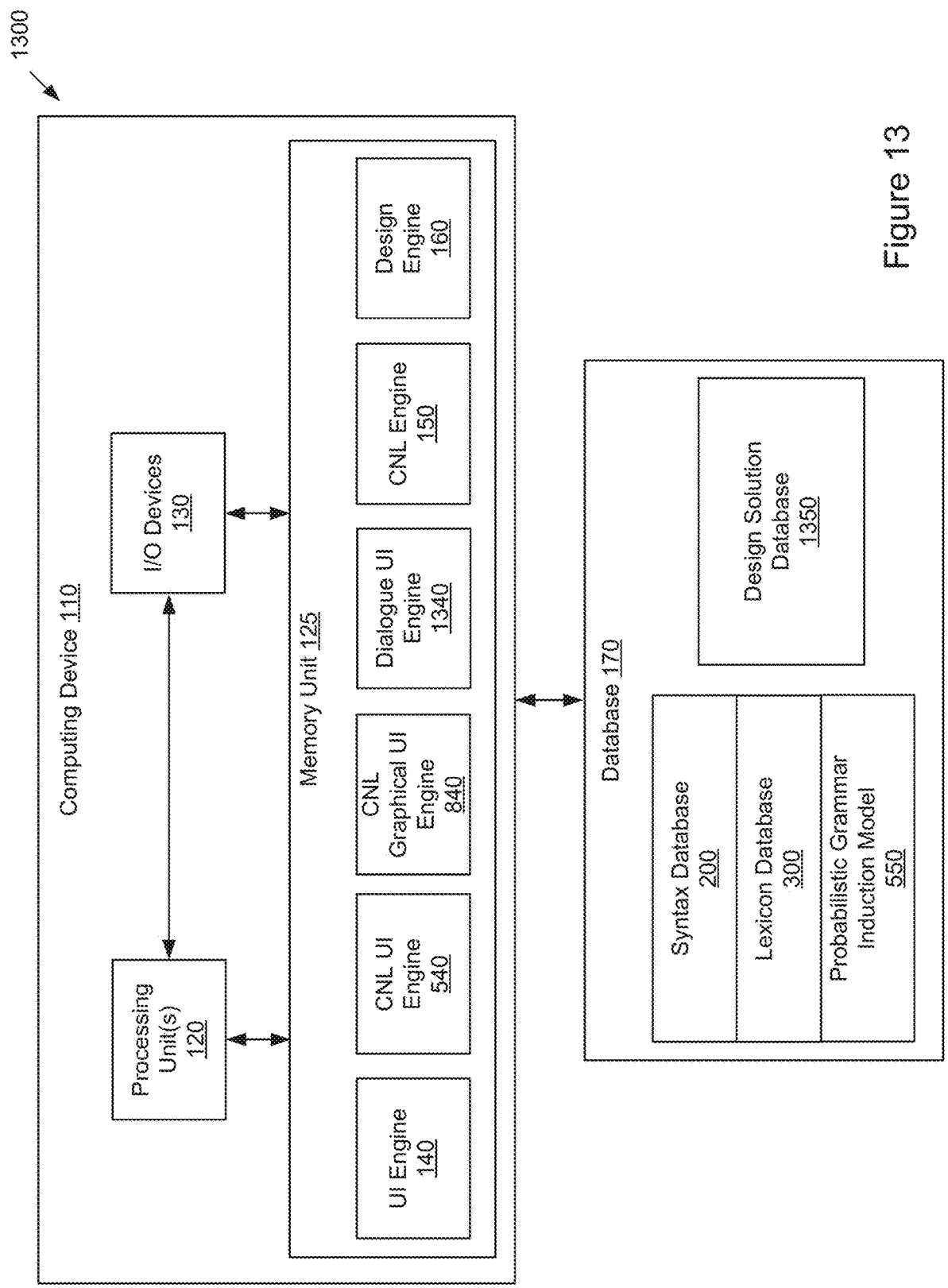
FIG. 13 illustrates yet another system configured to implement one or more aspects of the present invention.

FIG. 13 illustrates yet another system configured to implement one or more aspects of the present invention. As shown, the system 1300 includes, without limitation, a computing device 110 coupled to a database 170. Computing device 110 may be a server system, client system, workstation, a laptop computer, a tablet or hand-held device, or any other type of computing device. The system 1300 may comprise a computer-aided design (CAD) system. Several components shown in FIG. 13 have already described above in relation to FIGS. 1 and 5 and, therefore, are not discussed in detail here.

Computing device 110 includes one or more processing units 120 coupled to input/output (I/O) devices 130 and to memory unit 125. Memory unit 125 includes a UI engine 140, a CNL UI engine 540, a CNL graphical UI engine 840, a dialogue UI engine 1340, a controlled natural language (CNL) engine 150, and a design engine 160. A user/designer may input text information (e.g., natural-language based text or commands), received by the dialogue UI engine 1340, by typing on a keyboard. In other embodiments, a user/designer may input audio information, received by the dialogue UI engine 1340, by speaking into a microphone. In these embodiments, the dialogue UI engine 1340 comprises speech recognition software to process the received speech audio and convert to text information. Computing device 110 is coupled to the database 170 comprising a syntax database 200, lexicon database 300, a probabilistic grammar induction model 550, and a design solution database 1350.

Figure 14A:
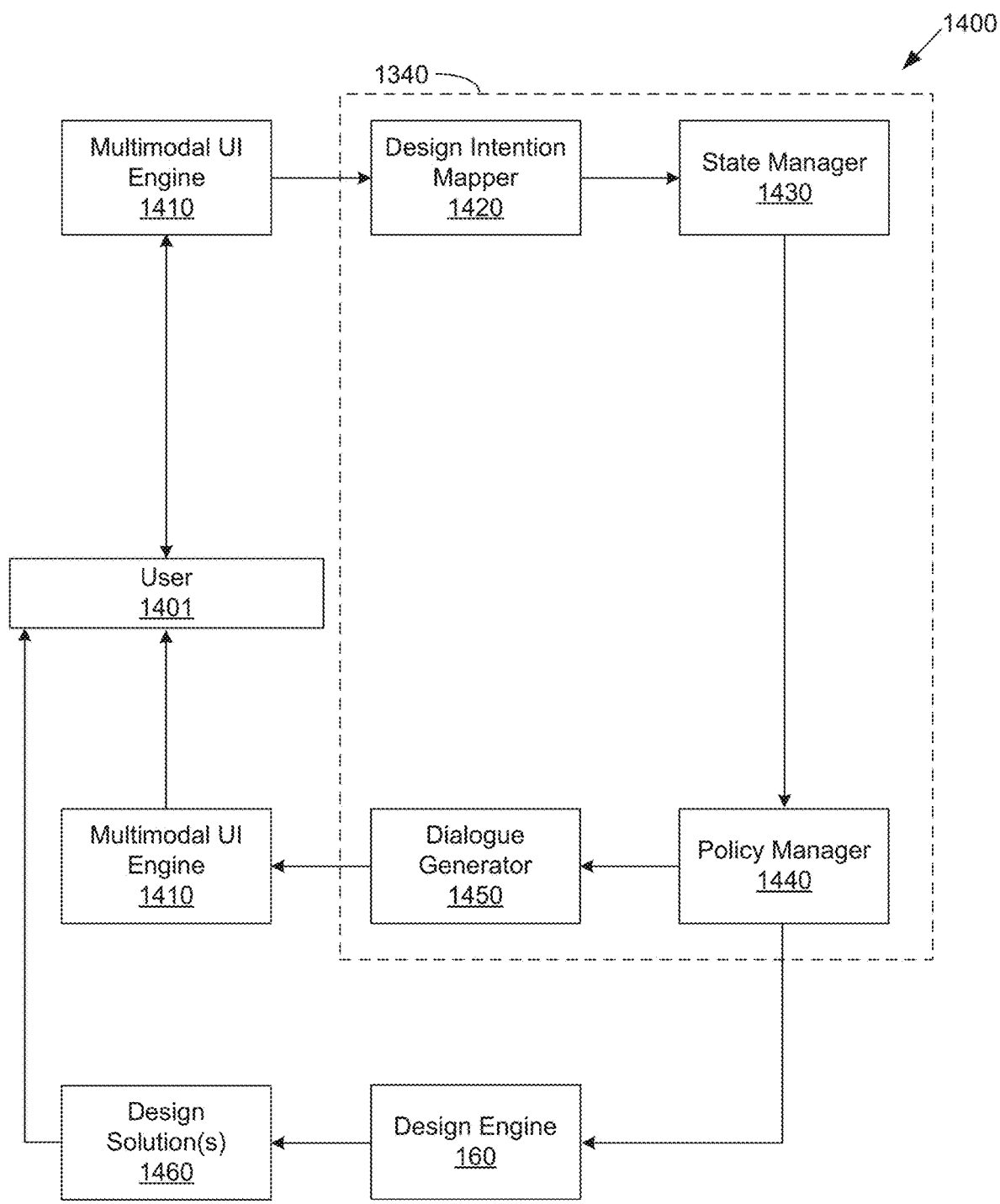
FIG. 14A is a conceptual diagram of a dialogue-based design process generated by the dialogue UI engine of FIG. 13, according to one embodiment of the present invention.

In some embodiments, the dialogue UI engine 1340 generates a user interface that generates a dialogue-based design process for users to explore possible design intention descriptions and design solutions. The dialogue UI engine 1340 may comprise a plurality of sub-modules/sub-engines for performing particular functions, as shown in FIG. 14A. The design solution database 1350 may store design solutions, such as existing design solutions and suggested design solutions generated by the dialogue-based design process implemented by the dialogue UI engine 1340. The user may query, browse and reuse design solutions stored in the design solution database 1350.

FIG. 14A is a conceptual diagram of a dialogue-based design process generated by the dialogue UI engine of FIG. 13, according to one embodiment of the present invention. As shown in FIG. 14A, the dialogue-based design process 1400 implements several computer engines, including multimodal user interface engine 1410, design engine 160, and sub-modules/sub-engines of the dialogue UI engine 1340. The dialogue UI engine 1340 may include sub-modules/sub-engines comprising a design intention mapper 1420, state manager 1430, policy manager 1440, and dialogue generator 1450.

The design process 1400 begins when a user 1401 interacts with a multimodal user interface engine 1410 to produce a first user input. In some embodiments, the multimodal user input engine 1410 comprises two separate components comprising a multimodal input interface engine and a multimodal output interface engine. In other embodiments, the multimodal user input engine 1410 may comprise a single integrated component comprising the multimodal input interface engine and the multimodal output interface engine. In general, the user input comprises a design intention description that describes intentions and goals of a design problem and/or design solution. For example, the design intention description may describe goals, functions, objectives, constraints, environment objects, or environment interactions of the design problem. In some embodiments, the user input comprises a CNL-compliant design problem statement. In these embodiments, the multimodal user interface engine 1410 may comprise the UI engine 140 or the CNL UI engine 540. For example, the steps 410-430 of FIG. 4 or the method 700 of FIG. 7 may be performed to produce a CNL-compliant design problem statement.

In other embodiments, the user input comprises any other form of design intention description. For example, the user input may comprise another natural-language based description other than CNL. In another example, the user input may comprise a graphical representation of a design problem statement described above in relation to FIGS. 8-12. In this example, the multimodal user interface engine 1410 may comprise the CNL graphical UI engine 840. As a further example, the user input may comprise a design solution (e.g., set of geometries, 3D model, etc.). In this example, the multimodal user interface engine 1410 may comprise a design engine 160 (e.g., geometry generator application, modeler application, etc.). Note that although the graphical representation and the design solution user inputs do not provide a natural-language based description of the design intention, they contain graphical/visual information that indicate the design intention.

As described, the user input may have a plurality of different forms and may be generated using different types of multimodal user interface engines 1410. To interact with the multimodal user interface engine 1410, the user may input text information (e.g., natural-language based text or commands) by typing on a keyboard. In other embodiments, the user may input audio information, received by the multimodal user interface engine 1410, by speaking into a microphone. In these embodiments, the multimodal user interface engine 1410 comprises speech recognition software to process the received speech audio and convert to text information.

As described below, the sub-engines of the dialogue UI engine 1340 may process the design intention description (user input) to produce a set of actions based at least in part on the design intention description. The set of actions may generate a suggested design intention description and/or executable job descriptions for producing suggested design solutions for the design intention description.

The design intention mapper 1420 of the dialogue UI engine 1340 receives the first user input (design intention description) and maps/converts the user input into a first set of observations regarding the design intention description. The first set of observations may comprise a set of abstract semantic representations of the received design intention description. In some embodiments, the set of observations may comprise different types of observations, each type of observation describing a different aspect of the design intention description. For example, the set of observations may include observations regarding a function aspect, objective aspect, constraint aspect, environment object aspect, or environment interaction aspect (or any combination thereof) relating to the design intention description. These types of aspects relating to a design problem and/or design solution are discussed in relation to FIG. 2, and, therefore, are not discussed in detail here.

Figure 14B:
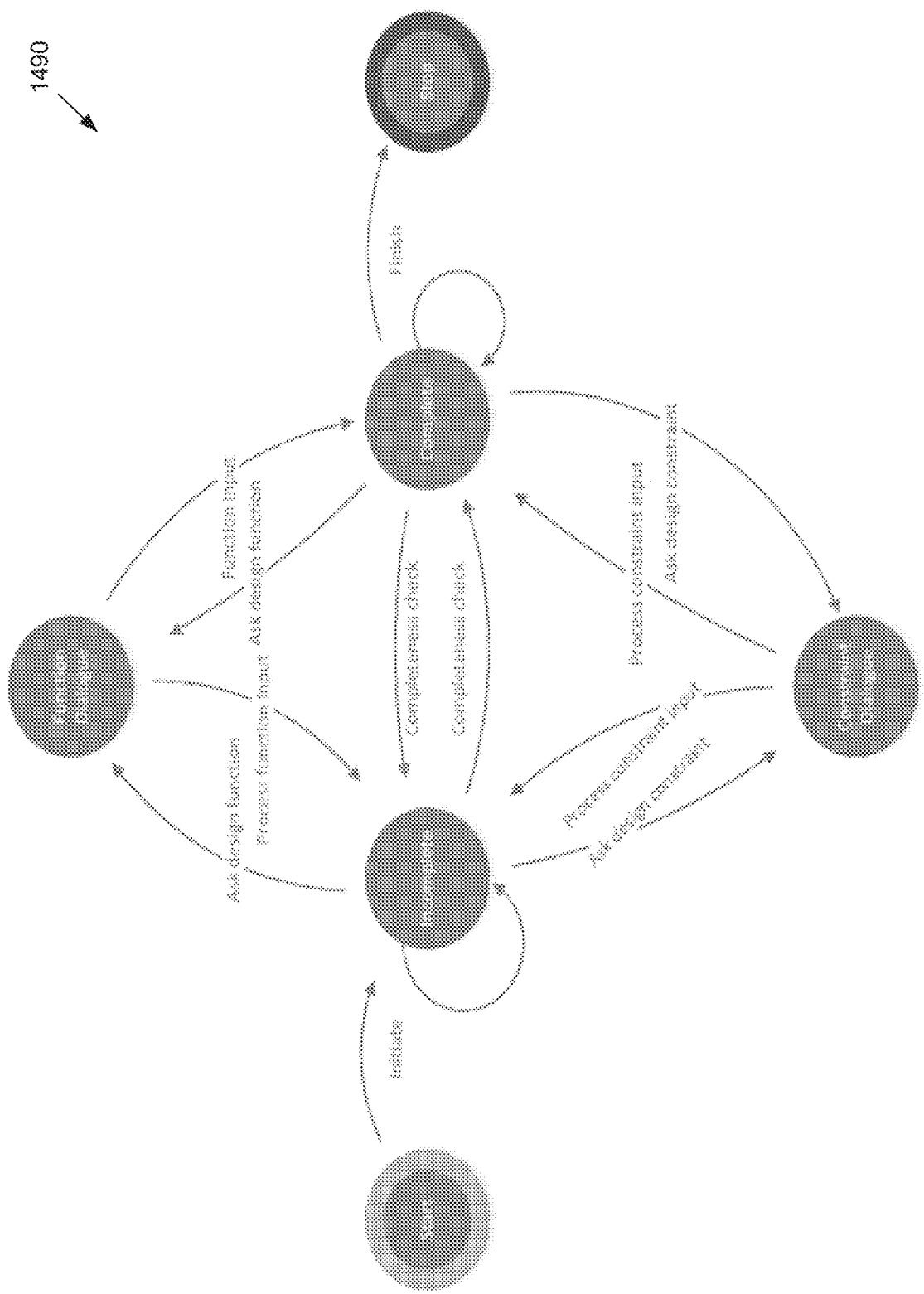
FIG. 14B is a conceptual diagram of a state machine implemented by the state manager of FIG. 14A, according to one embodiment of the present invention.

The state manager 1430 receives the first set of observations and updates a current state $S_t$ based on a set of observations. For example, if the state manager 1430 implements a Markov decision processes approach, the current state $S_t$ may start in an initial state $S_0$, and each subsequent state may be modelled by a transition probability: $p(S_t|S_{t-1}, a_{t-1})$. As the dialogue-based design process progresses, a reward may be assigned at each step in the process designed to mirror the desired characteristics of the dialogue system. A dialogue model M and a policy model P may then be optimized by maximizing the expected accumulated sum of these rewards either on-line through interaction with users or off-line from a corpus of dialogues collected within a similar domain. In some embodiments, the state manager 1430 may update the current state $S_t$ by implementing a state machine. FIG. 14B is a conceptual diagram of a state machine 1490 implemented by the state manager 1430 of FIG. 14A, according to one embodiment of the present invention. The state machine 1490 is exemplary only, and in other embodiments, another state machine may be used.

The policy manager 1440 receives the updated current state $S_t$, and determines and executes a set of one or more actions based on the current state $S_t$ and a set of rules (policy). The policy manager 1440 may determine and execute a different set of actions at each different state $S_t$. The set of actions is based on the current state $S_t$ and the policy as expressed by the equation $a_t=P_i(S_t)$, where $a_t$ comprises the set of actions, $P_i$ comprises the policy/set of rules, and $S_t$ comprises the current state. The set of rules of the policy may be either manually authored/created or automatically generated, for example, using partially observable Markov decision processes (POMDPs). As known in the art, POMDP is a generalization of a Markov decision process (MDP) which implements a mathematical framework for modeling decision making. In other embodiments, other techniques are used to generate the policy.

Note that since the set of actions determined and executed by the policy manager 1440 is based at least in part on the current state $S_t$, which in turn is based at least in part on the set of observations, which in turn is based at least in part on the design intention description (first user input), the set of actions are effectively based at least in part on the design intention description.

The set of actions determined and executed by the policy manager 1440 may comprise two general types of actions including 1) producing a system response to the user based on the first user input, and 2) producing one or more executable job descriptions for producing one or more design solutions for the design problem based on the first user input. The policy manager 1440 may determine to perform one or both types of actions in response to the user input. The system response may include a modified set of observations that are a modification of the first set of observations generated by the design intention mapper 1420 (e.g., by modifying, deleting, or adding to the first set of observations). As the first set of observations are mapped/converted from the first user input, the system response may comprise a suggestion to the user for modifying the first user input. The one or more executable job descriptions may be generated for producing one or more suggested design solutions based on the user input, the suggested design solutions comprising suggestions for possible design solutions to the design problem described in the first user input. If one of the actions in the set of actions comprises producing a system response, the system response is sent to the dialogue generator 1450. If one of the actions in the set of actions comprises producing one or more executable job descriptions, the one or more executable job descriptions is sent to the design engine 160.

The dialogue generator 1450 receives the system response and converts the system response into a suggested/modified user input. The dialogue generator 1450 may do so by performing the inverse operation of the design intention mapper 1420 by converting the modified set of observations of the system response into a suggested user input that is in the same form as the first user input. For example, if the first user input comprised a natural-language based design intention description, the suggested user input may comprise a modified natural-language based design intention description. As a further example, if the first user input comprised a graphical representation or a design solution, the suggested user input may comprise a modified graphical representation or a modified design solution. The suggested/modified user input is sent to the multimodal user interface engine 1410 which displays the suggested/modified user input for consideration by the user 1401. The displayed suggested user input may comprise a suggestion to the user 1401 for modifying the first user input.

The design engine 160 may receive one or more executable job descriptions and generate one or more suggested design solutions 1460 for consideration by the user 1401. The one or more suggested design solutions 1460 may be stored to the design solution database 1350. The suggested design solutions 1460 may comprise suggestions for possible design solutions to the first user input for consideration by the user 1401.

The user 1401 may receive and consider the suggested user input and/or the one or more suggested design solutions 1460. As discussed above, the suggested user input may comprise a suggestion to the user 1401 for modifying the first user input and the suggested design solution(s) 1460 may comprise suggestions for possible design solutions to the first user input. Based on the suggested user input and/or the suggested design solution(s), the user then interacts with the multimodal user interface engine 1410 to produce a second user input. The design process 1400 then repeats for the second user input to explore other possible design intention statements and/or design solutions. In this manner, the iterative dialogue-based design process 1400 may assist the user to find an optimal design solution.

Figure 15:
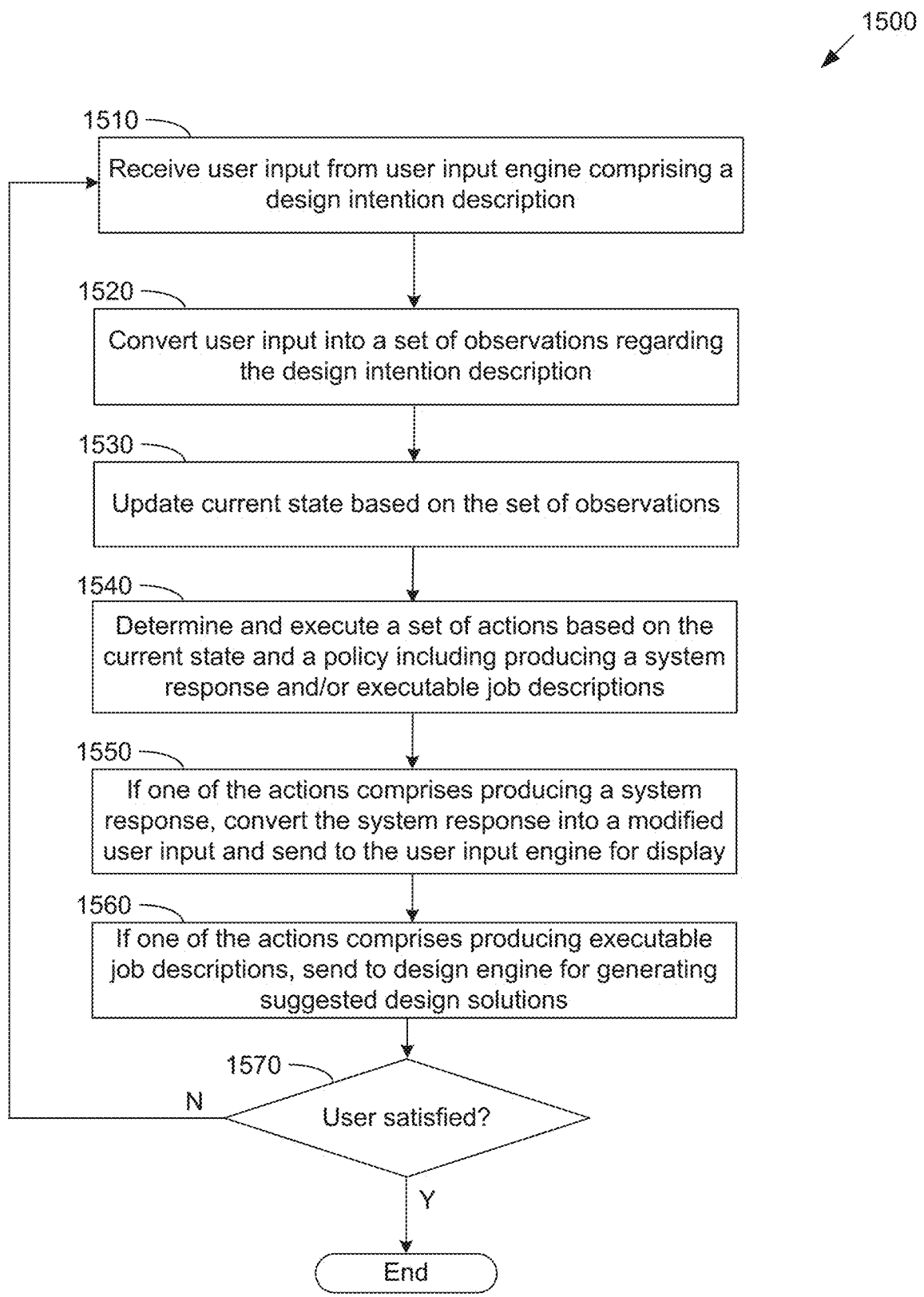
FIG. 15 illustrates a flow diagram of method steps for generating a dialogue-based design process, according to one embodiment of the present invention.

FIG. 15 illustrates a flow diagram of method steps for generating a dialogue-based design process, according to one embodiment of the present invention. Although the method steps are described in conjunction with the systems of FIG. 13-14, persons skilled in the art will understand that any system configured to perform the method steps, in any order, is within the scope of the present invention.

As shown, a method 1500 begins at step 1510, where the design intention mapper 1420 of the dialogue UI engine 1340, when executed by processing unit 150, receives a first user input from a multimodal user interface engine 1410. The first user input may comprise a design intention description that describes intentions and goals of a design problem and/or design solution. The first user input may be specified in a variety of different forms, such as a natural-language based description (e.g., CNL), graphical representation, or a design solution.

At step 1520, the design intention mapper 1420 maps/converts the first user input into a first set of observations regarding the design intention description. The set of observations may comprise a set of abstract semantic representations, each describing a different aspect of the design intention description (such as function, objective, constraint, environment object, environment interaction, or any combination thereof). At step 1530, the state manager 1430 updates a current state $S_t$ based on the first set of observations.

At step 1540, the policy manager 1440 determines and executes a set of one or more actions based on the current state $S_t$ and a set of rules (policy). The set of actions may comprise generating a system response to the user and/or producing one or more executable job descriptions based on the first user input. The system response may include a modified set of observations that are a modification of the first set of observations. Note that, because the set of actions is determined based at least in part on the current state $S_t$, which in turn is based at least in part on the set of observations, which in turn is based at least in part on the design intention description (first user input), the set of actions are effectively based at least in part on the design intention description.

At step 1550, if one of the actions in the set of actions comprises producing a system response, the dialogue generator 1450 converts the system response into a suggested user input and sends the suggested user input to the multimodal user interface engine 1410. The dialogue generator 1450 may do so by performing the inverse operation of the design intention mapper 1420 by converting the modified set of observations of the system response into a suggested user input that is in the same form as the first user input. The method 1500 then causes the suggested user input (modified design intention description) to be executed for display by the multimodal user interface engine 1410 for consideration by the user 1401.

At step 1560, if one of the actions in the set of actions comprises producing one or more executable job descriptions, the one or more executable job descriptions is sent to the design engine 160. The design engine 160 may execute the one or more executable job descriptions and generate one or more suggested design solutions 1460 for consideration by the user 1401. The one or more suggested design solutions 1460 may also be stored to the design solution database 1350.

The user 1401 may receive and consider the suggested user input and/or the one or more suggested design solutions 1460. The suggested user input may comprise a suggested user input and the suggested design solution(s) 1460 may comprise suggested design solutions to the first user input. At step 1570, the dialogue UI engine 1340 determines if the user is satisfied with the suggested design solutions. For example, the dialogue UI engine 1340 may receive a selection of an interactive button or particular text/speech that indicates the user wants to end the dialogue-based design process. If so, the method 1500 ends. If not, the method 1500 continues at step 1510 where the design intention mapper 1420 receives a second user input from the multimodal user interface engine 1410. Based on the suggested user input and/or the suggested design solution(s), the user may interact with the multimodal user interface engine 1410 to produce the second user input. The method 1500 then repeats for the second user input (in place of the first user input) to explore other possible design intention statements and/or design solutions.

In sum, a dialogue UI engine 1340 on a computing device 110 is configured to implement a dialogue-based design process for assisting users to more fully explore possible design intentions and design solutions. The dialogue UI engine may receive a user input comprising a design intention description that describes intentions and goals of a design problem and/or design solution. The design intention description may be in a variety of different forms. The dialogue UI engine interprets the design intention description and may respond with suggestions of modifications to the design intention description and/or one or more suggested design solutions. Based on the suggestions, the user may respond with a modified design intention description, which the dialogue UI engine again interprets and responds with suggestions for modifications to the design intention description and/or suggested design solutions.

At least one advantage of the disclosed technique is that the dialogue-based design process allows the user to interact with the dialogue UI engine in an iterative manner to discover design intention descriptions and/or design solutions not previously considered or explored. The iterative dialogue-based design process may assist the user to find an optimal design solution.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. A computer-implemented method for generating design solutions, the method comprising:

receiving, from a user, a first design problem statement comprising a plurality of problem statements delineated in a controlled natural language (CNL) that defines one or more lexicons and one or more sentence structures permitted for problem statements, wherein the controlled natural language (CNL) comprises a human-based language and not a computer-based language, the plurality of problem statements including a first problem statement and a second problem statement;

determining that each of the first problem statement and the second problem statement in the first design problem statement complies with at least one sentence structure defined by the CNL that specifies a position and an order of a set of non-selectable fixed terms and a set of user-selectable terms, wherein the first problem statement complies with a first sentence structure defined by the CNL as permitted for a function problem statement, and the second problem statement complies with a second sentence structure defined by the CNL as permitted for a constraint problem statement, and wherein the second sentence structure is different than the first sentence structure as defined by the CNL;

processing the first design problem statement based on the one or more lexicons and the one or more sentence structures to produce an executable description; and executing the executable description using a design application for generating a first design solution for the first design problem statement.

2. The computer-implemented method of claim 1, further comprising: before processing the first design problem statement, determining that the first design problem statement is compliant with the lexicons and sentence structures of the CNL.

3. The computer-implemented method of claim 1, wherein processing the first design problem statement comprises:
parsing the plurality of problem statements based on the lexicons and sentence structures of the CNL to produce a parsed representation of the first design problem statement that includes a first design problem model; and
generating the executable description based on the first design problem model.

4. The computer-implemented method of claim 1, wherein the plurality of problem statements comprises a plurality of different types of problem statements, each type of problem statement describing a different aspect of the design problem.

5. The computer-implemented method of claim 4, wherein the first problem statement describes functional requirements of the first design solution.

6. The computer-implemented method of claim 5, wherein the plurality of problem statements comprises at least one objective problem statement that specifies a property in the first design solution to be maximized or minimized.

7. The computer-implemented method of claim 5, wherein the second problem statement specifies a limit of a property that the first design solution cannot exceed.

8. The computer-implemented method of claim 1, wherein processing the first problem statement is performed in response to determining that each problem statement received from the user in the first design problem statement complies with at least one sentence structure defined by the CNL.

9. The computer-implemented method of claim 1, wherein the plurality of problem statements comprises a plurality of different types of problem statements including at least one function problem statement and at least one of an objective problem statement, a constraint problem statement, an environment object problem statement, and an environment interaction problem statement.

10. The computer-implemented method of claim 1, wherein the second problem statement comprises at least one user-selectable term that specifies a math operator.

11. The computer-implemented method of claim 1, wherein:
the CNL specifies a first plurality of sentence structures permitted for a function problem statement; and
the first problem statement complies with the first sentence structure within the first plurality of sentence structures, the first sentence structure specifying a first set of non-selectable fixed terms, a first set of user-selectable terms, and a position and an order of the fixed terms and the user-selectable terms within the first problem statement.

12. The computer-implemented method of claim 11, wherein:
the CNL specifies a second plurality of sentence structures permitted for a constraint problem statement; and
the second problem statement complies with the second sentence structure within the second plurality of sentence structures, the second sentence structure specifying a second set of non-selectable fixed terms, a second set of user-selectable terms, and a position and an order of the fixed terms and the user-selectable terms within the second problem statement.

13. The computer-implemented method of claim 12, wherein:
the first set of non-selectable fixed terms specified by the first sentence structure is different from the second set of non-selectable fixed terms specified by the second sentence structure; and
the first set of user-selectable terms specified by the first sentence structure is different from the second set of user-selectable terms specified by the second sentence structure.

14. A non-transitory computer-readable medium storing program instructions that, when executed by a processor, cause the processor to process a design problem statement by performing the steps of:
receiving, from a user, a first design problem statement comprising a plurality of problem statements delineated in a controlled natural language (CNL) that defines one or more lexicons and one or more sentence structures permitted for problem statements, wherein the controlled natural language (CNL) comprises a human-based language and not a computer-based language, the plurality of problem statements including a first problem statement and a second problem statement;
determining that each of the first problem statement and the second problem statement in the first design problem statement complies with at least one sentence structure defined by the CNL that specifies a position and an order of a set of non-selectable fixed terms and a set of user-selectable terms, wherein the first problem statement complies with a first sentence structure defined by the CNL as permitted for a function problem statement, and the second problem statement complies with a second sentence structure defined by the CNL as permitted for a constraint problem statement, and wherein the second sentence structure is different than the first sentence structure as defined by the CNL;
processing the first design problem statement based on the one or more lexicons and the one or more sentence structures to produce an executable description; and
executing the executable description using a design application for generating a first design solution for the first design problem statement.

15. The non-transitory computer-readable medium of claim 14, further comprising the step of: before processing the first design problem statement, determining that the first design problem statement is compliant with the lexicons and sentence structures of the CNL.

16. The non-transitory computer-readable medium of claim 14, wherein processing the first design problem statement comprises:
parsing the plurality of problem statements based on the lexicons and sentence structures of the CNL to produce a parsed representation of the first design problem statement that includes a first design problem model; and
generating the executable description based on the first design problem model.

17. The non-transitory computer-readable medium of claim 14, wherein the plurality of problem statements comprises a plurality of different types of problem statements, each type of problem statement describing a different aspect of the design problem.

18. The non-transitory computer-readable medium of claim 17, wherein the plurality of different types of problem statements comprises function, objective, constraint, and environment object problem statements.

19. The non-transitory computer-readable medium of claim 14, wherein lexicons defined by the CNL specify selectable terms permitted in a problem statement.

20. The non-transitory computer-readable medium of claim 14, wherein:
the CNL defines a plurality of different types of selectable terms; and
for each type of selectable term, the CNL defines a lexicon of terms permitted for the type of selectable terms.

21. The non-transitory computer-readable medium of claim 14, wherein the design application comprises a computer-aided design (CAD) application, computer-aided engineering (CAE) application, simulator application, modeler application, or geometry generator application.

22. A system configured for processing a design problem statement, comprising:
a memory that includes a user interface (UI) engine and a controlled natural language (CNL) engine; and
a processor coupled to the memory, wherein, upon executing the UI engine and the CNL engine, is configured to:
receive, from a user, a first design problem statement comprising a plurality of problem statements delineated in a controlled natural language (CNL) that defines one or more lexicons and one or more sentence structures permitted for problem statements, wherein the controlled natural language (CNL) comprises a human-based language and not a computer-based language, the plurality of problem statements including a first problem statement and a second problem statement;
determine that each of the first problem statement and the second problem statement in the first design problem statement complies with at least one sentence structure defined by the CNL that specifies a position and an order of a set of non-selectable fixed terms and a set of user-selectable terms, wherein the first problem statement complies with a first sentence structure defined by the CNL as permitted for a function problem statement, and the second problem statement complies with a second sentence structure defined by the CNL as permitted for a constraint problem statement, and wherein the second sentence structure is different than the first sentence structure as defined by the CNL;
process the first design problem statement based on the one or more lexicons and the one or more sentence structures to produce an executable description; and
execute the executable description using a design application for generating a first design solution for the first design problem statement.

23. The system of claim 22, wherein the processor executes the UI engine and the CNL engine further for: before processing the first design problem statement, determining that the first design problem statement is compliant with the lexicons and sentence structures of the CNL.

* * * * *

UNITED STATES PATENT AND TRADEMARK OFFICE
CERTIFICATE OF CORRECTION

PATENT NO. : 10,839,110 B2
APPLICATION NO. : 14/707869
DATED : November 17, 2020
INVENTOR(S) : Francesco Iorio, Wei Li and Hyunmin Cheong Page 1 of 1

It is certified that error appears in the above-identified patent and that said Letters Patent is hereby corrected as shown below:

On the Title Page

Page 2 (56) References Cited Column 2, Line 51:
Please delete "Becallini N, Borgianni Y, Cascini G, Rotini F (2012) Model and algorithm for computer-aided inventive problem analysis. Computer-Aided Design 44: 961-986." and insert --Becattini N, Borgianni Y, Cascini G, Rotini F (2012) Model and algorithm for computer-aided inventive problem analysis. Computer-Aided Design 44: 961-986.--.

Signed and Sealed this
Nineteenth Day of January, 2021

Andrei Iancu
*Director of the United States Patent and Trademark Office*